(12) United States Patent
Wang et al.

(10) Patent No.: US 12,211,656 B2
(45) Date of Patent: Jan. 28, 2025

(54) PHOTOVOLTAIC STRUCTURE AND METHOD OF FABRICATION

(71) Applicant: Maxeon Solar Pte. Ltd., Singapore (SG)

(72) Inventors: Lili Wang, Fremont, CA (US); Nadeem Haque, Fremont, CA (US); Jeong Chul Lee, Fremont, CA (US)

(73) Assignee: Maxeon Solar Pte. Ltd., Singapore (SG)

( * ) Notice: Subject to any disclaimer, the term of this patent is extended or adjusted under 35 U.S.C. 154(b) by 0 days.

(21) Appl. No.: 16/999,995

(22) Filed: Aug. 21, 2020

(65) Prior Publication Data

US 2022/0059294 A1     Feb. 24, 2022

(51) Int. Cl.
    *H01G 9/20*              (2006.01)
    *H01G 9/00*              (2006.01)
    (Continued)

(52) U.S. Cl.
    CPC ......... *H01G 9/2072* (2013.01); *H01G 9/0036* (2013.01); *H01G 9/2009* (2013.01);
    (Continued)

(58) Field of Classification Search
    CPC ............... H01L 27/302; H01L 31/0508; H01L 31/0687; H01L 31/0725; H01L 31/076;
    (Continued)

(56) References Cited

U.S. PATENT DOCUMENTS 7,122,398 B1 * 10/2006 Pichler ................ H01L 31/0508
                                                                   438/66
7,635,810 B2 * 12/2009 Luch .................. H01L 31/0392
                                                                   136/244
(Continued)

FOREIGN PATENT DOCUMENTS

| JP | 2009259926 A | * 11/2009 |
|---|---|---|
| KR | 10-2019-0053374 A | 5/2019 |
| WO | WO2019016118 A1 | 1/2019 |

OTHER PUBLICATIONS

JP-2009259926-A English machine translation (Year: 2009).*
(Continued)

*Primary Examiner* — Andrew J Golden
(74) *Attorney, Agent, or Firm* — Schmidt Patent Law, Inc.

(57) ABSTRACT

A photovoltaic device includes one or more features that taken alone or in combination enhance its efficiency. Some embodiments may comprise a tandem solar device in which a top PV cell is fabricated upon a front transparent substrate, that also serves as the top encapsulating substance. The top PV cell including the front encapsulating substance is then bonded (e.g., using adhesive) to a bottom PV cell in order to complete the tandem device. Using the same transparent, insulating element as both front encapsulating substance and a substrate for fabricating the top PV cell, obviates to the need to provide a separate structure (with resulting interfaces) to perform the latter role. For tandem and non-tandem PV devices, a Through-Substrate-Via (TSV) structure may extend through an insulating substrate in order to provide (Continued)

contact with an opposite side (e.g., back electrode). Embodiments may find particular use in fabricating shingled perovskite photovoltaic solar cells.

8 Claims, 29 Drawing Sheets

(51) Int. Cl.
| | |
|---|---|
| H01L 31/0296 | (2006.01) |
| H01L 31/0304 | (2006.01) |
| H01L 31/032 | (2006.01) |
| H01L 31/0352 | (2006.01) |
| H10K 19/20 | (2023.01) |
| H10K 30/30 | (2023.01) |
| H10K 30/57 | (2023.01) |
| H10K 30/82 | (2023.01) |
| H10K 30/88 | (2023.01) |
| H10K 77/10 | (2023.01) |
| H10K 85/20 | (2023.01) |

(52) U.S. Cl.
CPC .......... *H01G 9/2077* (2013.01); *H01G 9/2095* (2013.01); *H01L 31/0296* (2013.01); *H01L 31/0304* (2013.01); *H01L 31/0322* (2013.01); *H01L 31/0326* (2013.01); *H01L 31/035218* (2013.01); *H10K 19/20* (2023.02); *H10K 30/30* (2023.02); *H10K 30/57* (2023.02); *H10K 30/82* (2023.02); *H10K 30/88* (2023.02); *H10K 77/111* (2023.02); *H10K 85/221* (2023.02)

(58) Field of Classification Search
CPC ............ H01L 31/0296; H01L 31/0304; H01L 31/0322; H01L 31/0326; H01L 31/035218; H01L 51/0048; H01L 51/0097; H01L 51/4253; H01L 51/442; H01L 51/448; H01L 31/047; H01L 31/043; H01L 51/4246; H01L 31/022441; H01L 31/0682; H01G 9/2072; H01G 9/0036; H01G 9/2009; H01G 9/2095; H01G 9/2077; H10K 30/88; H10K 30/57; H10K 30/30; H10K 30/82; H10K 19/20; H10K 85/221; H10K 77/111
USPC .......................................................... 136/255
See application file for complete search history.

(56) References Cited

U.S. PATENT DOCUMENTS

| | | | | |
|---|---|---|---|---|
| 8,138,410 | B2* | 3/2012 | Hovel ................ | H01L 31/0465 |
| | | | | 136/262 |
| 8,859,885 | B2* | 10/2014 | Vermeersch ........ | H01L 31/0725 |
| | | | | 438/66 |
| 2005/0274408 | A1 | 12/2005 | Li et al. | |
| 2006/0180197 | A1* | 8/2006 | Gui ...................... | H01L 31/0504 |
| | | | | 136/255 |
| 2007/0113885 | A1* | 5/2007 | Chan .................... | H01G 9/2081 |
| | | | | 136/256 |
| 2012/0097215 | A1* | 4/2012 | Vermeersch ....... | H01L 31/02013 |
| | | | | 136/246 |
| 2012/0125391 | A1 | 5/2012 | Pinarbasi et al. | |
| 2012/0160308 | A1* | 6/2012 | Tseng .................... | H01L 27/302 |
| | | | | 136/255 |
| 2015/0318477 | A1* | 11/2015 | Irwin .................... | H10K 30/30 |
| | | | | 204/192.1 |
| 2016/0307704 | A1* | 10/2016 | Hillhouse ............. | H10K 30/88 |
| 2017/0084399 | A1* | 3/2017 | Vak ..................... | H01L 51/442 |
| 2017/0084766 | A1* | 3/2017 | Yang ................... | H01L 31/0508 |
| 2017/0125172 | A1* | 5/2017 | Gong .................. | H10K 30/353 |
| 2017/0271622 | A1 | 9/2017 | Chaudhari | |
| 2018/0309077 | A1* | 10/2018 | Bush .................... | H01L 31/0725 |
| 2018/0374977 | A1* | 12/2018 | Geerligs ......... | H01L 31/022441 |
| 2019/0244766 | A1* | 8/2019 | Matsuo ................ | H01L 51/448 |
| 2020/0028014 | A1* | 1/2020 | Fessehatzion ...... | H01L 31/0322 |
| 2021/0074871 | A1* | 3/2021 | Nagle .................. | H01L 31/043 |

OTHER PUBLICATIONS

Fu, Back Contact Dye-sensitized Solar Cells, Diss. Monash University Jan. 2012. (Year: 2012).*
International Search Report and Written Opinion for PCT/US2021/046734, mailed Dec. 1, 2021.

* cited by examiner

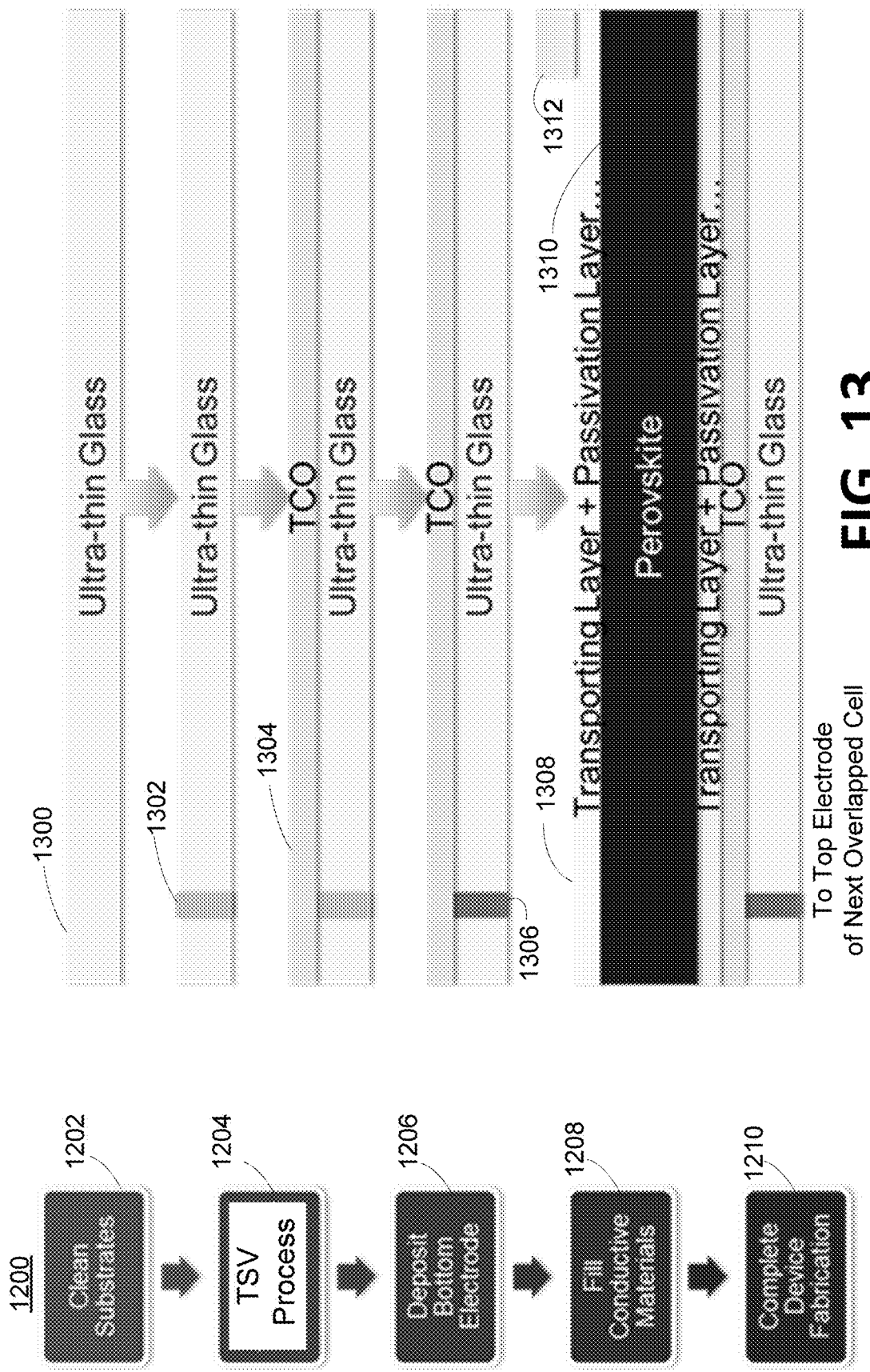

FIG. 18
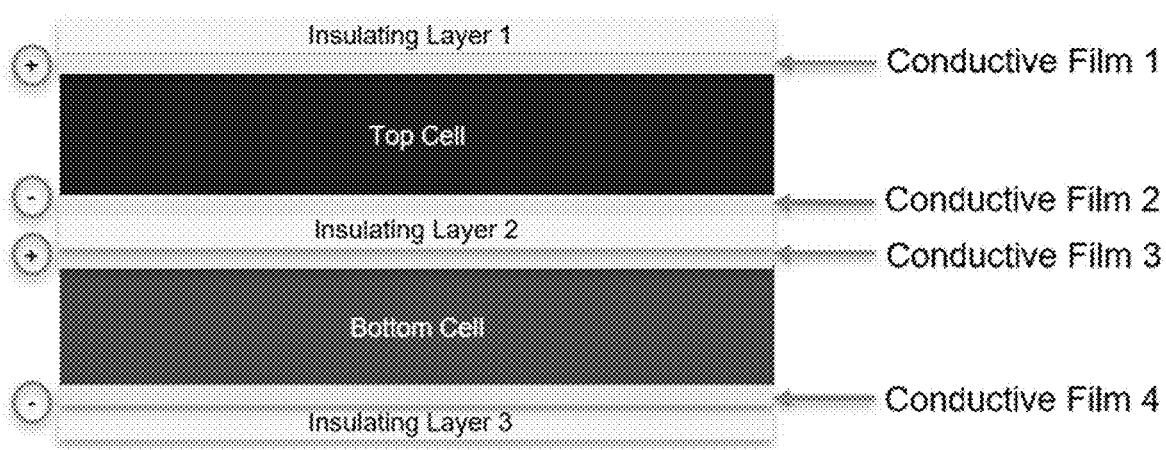
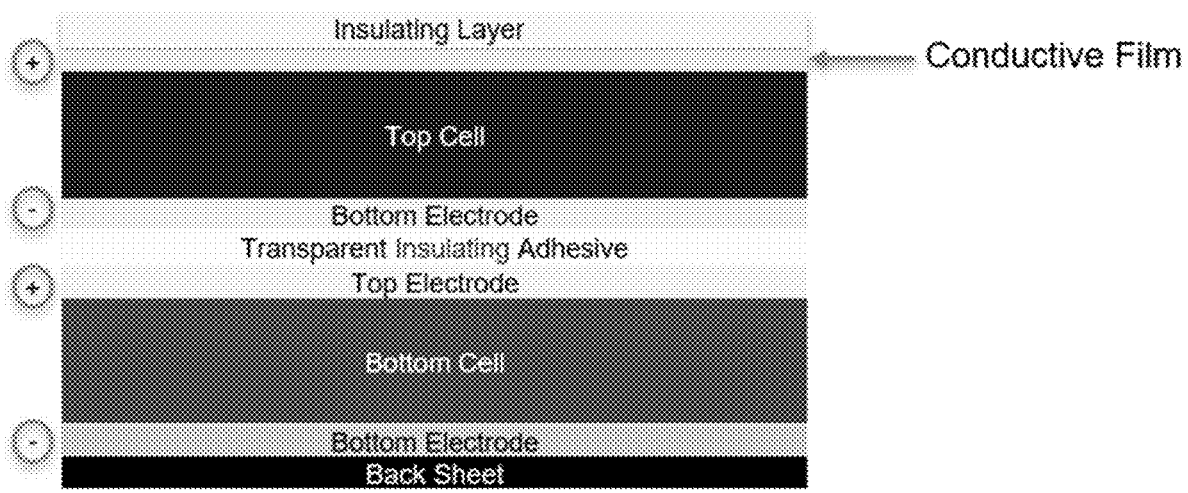
FIG. 19

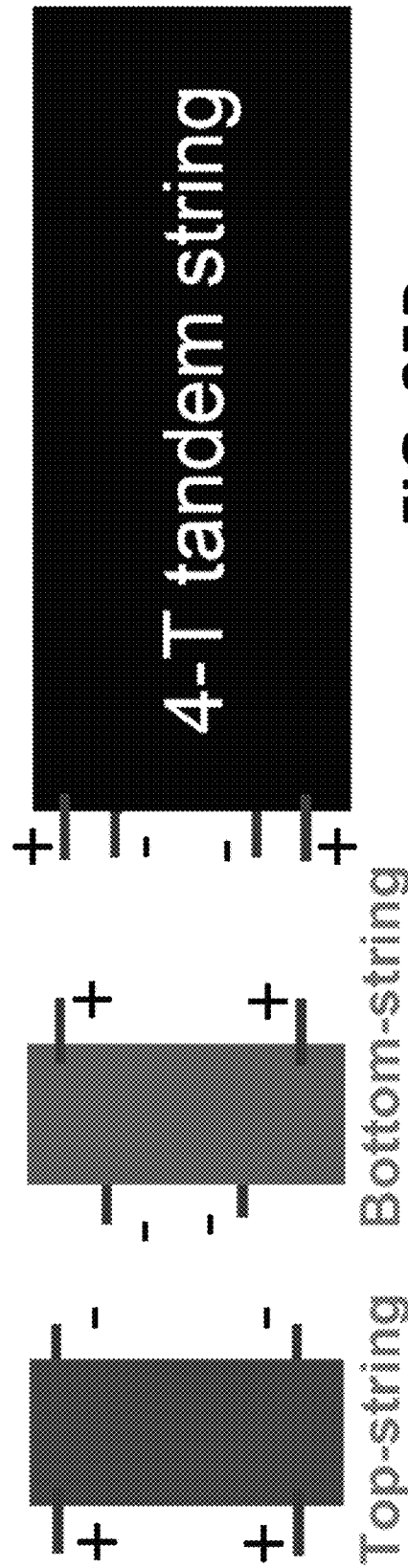
FIG. 25A
FIG. 25B
FIG. 25C
FIG. 25D

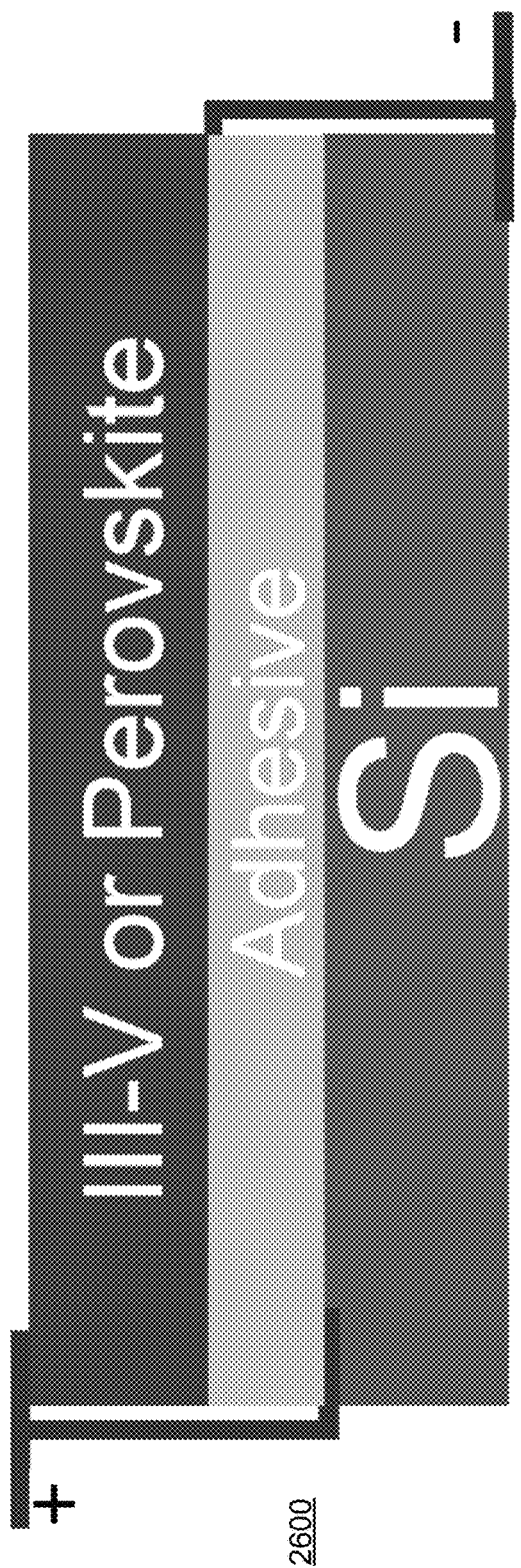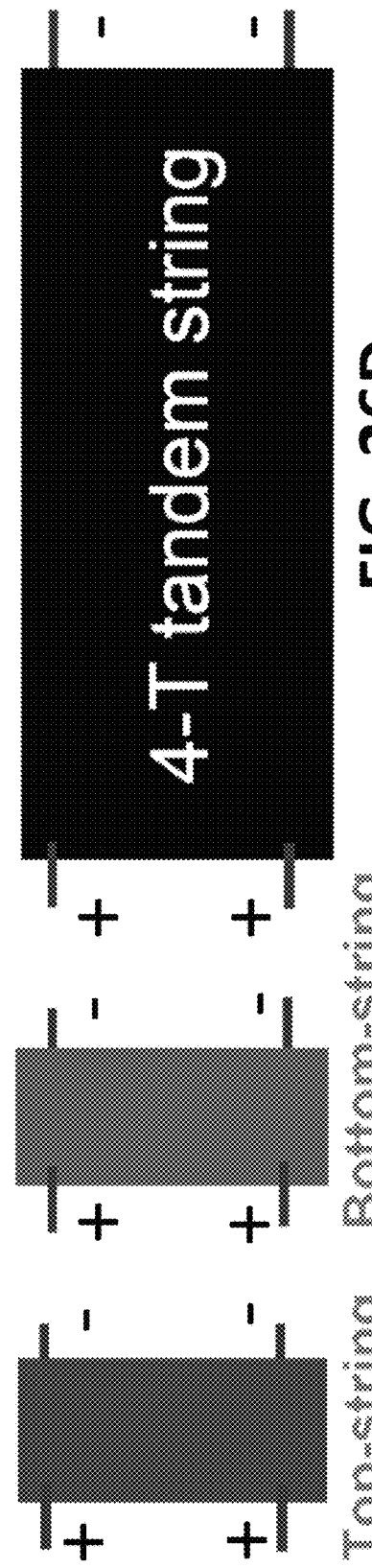

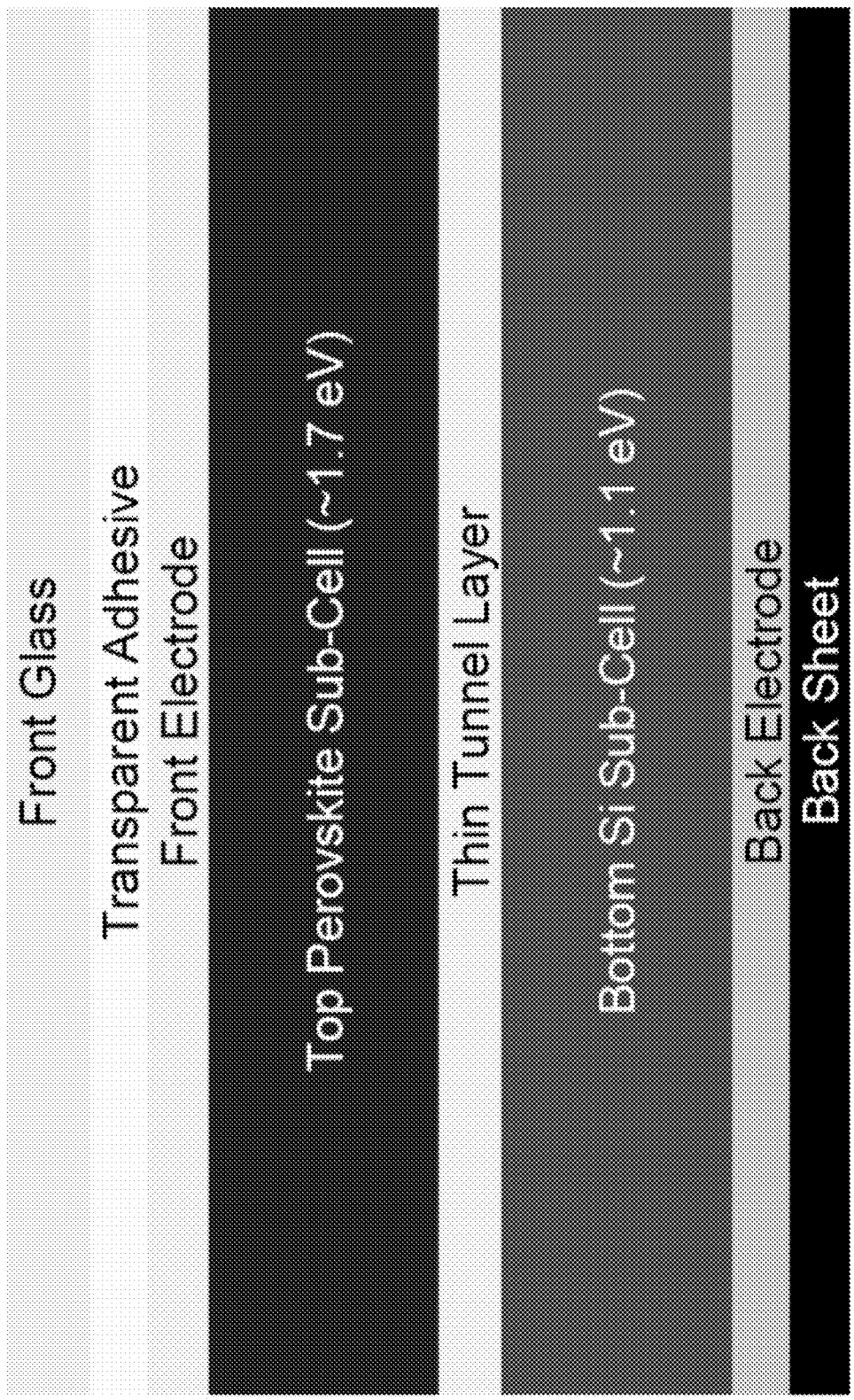
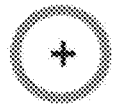
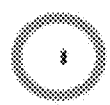
FIG. 32

PHOTOVOLTAIC STRUCTURE AND METHOD OF FABRICATION

BACKGROUND

Photovoltaic (PV) devices are becoming an increasingly important element of global energy production. As technologies for creating photovoltaic materials are improved and economies of scale manifest, the price of photovoltaic material has been dropping at an exponential rate, making photovoltaic installations increasingly cost-competitive with other energy production technologies.

SUMMARY

Embodiments relate to a photovoltaic device including one or more features that taken alone or in combination enhance its efficiency. Certain embodiments may comprise a tandem solar device in which a top PV cell is fabricated directly upon a front transparent substrate that also serves as the top encapsulating substance.

The top PV cell including the front encapsulating substance is then bonded (e.g., using adhesive) to a bottom PV cell in order to complete the tandem device. Using the same transparent, insulating element as both front encapsulating substance and a substrate for fabricating the top PV cell, obviates to the need to provide a separate structure to perform the latter role. By eliminating unneeded intervening material layers and interfaces, embodiments reduce cost and enhance optical efficiency of the tandem PV device architecture.

Some embodiments feature an interconnection configuration for optoelectronic devices utilizing an insulating substance as substrate, and a method of fabricating said interconnect. Specific embodiments introduce a Through-Substrate-Via (TSV) structure that extends through an insulating substrate in order to provide contact with an opposite side (e.g., back electrode). Certain embodiments may find particular use in optoelectronic applications that call for high light transmittance in multi-layered structures. More specifically, certain embodiments featuring TSVs according to embodiments may be employed in making shingled perovskite photovoltaic solar cells.

Embodiments featuring tandem PV structures that further include TSV structures, are also disclosed.

BRIEF DESCRIPTION OF THE DRAWINGS

FIG. 12 shows a simplified flow diagram of a process according to an embodiment for fabricating a solar device featuring TSVs.

FIG. 13 shows simplified cross-sectional views of a TSV fabrication process according to an embodiment.

FIG. 18 shows a simplified cross-sectional view of an embodiment of a tandem device featuring a multi-layer structure.

FIG. 19 shows a simplified cross-sectional view of an embodiment of a tandem device featuring a multi-layer structure.

FIGS. 25A-D show various views of a module embodiment featuring tandem devices having top and bottom cells connected in series.

FIGS. 26A-D show various views of a module embodiment featuring tandem devices having top and bottom cells connected in parallel.

FIG. 32 shows a simplified cross-sectional view of one embodiment of a 2-T tandem device.

DETAILED DESCRIPTION

A detailed description of embodiments is provided below along with accompanying figures. The scope of this disclosure is limited only by the claims and encompasses numerous alternatives, modifications and equivalents. Although steps of various processes are presented in a particular order, embodiments are not necessarily limited to being performed in the listed order. In some embodiments, certain operations may be performed simultaneously, in an order other than the described order, or not performed at all.

Numerous specific details are set forth in the following description. These details are provided in order to promote a thorough understanding the scope of this disclosure by way of specific examples, and embodiments may be practiced according to the claims without some or all of these specific details. Accordingly, the specific embodiments of this disclosure are illustrative, and are not intended to be exclusive or limiting. For the purpose of clarity, technical material that is known in the technical fields related to this disclosure has not been described in detail so that the disclosure is not unnecessarily obscured.

Single junction photovoltaic solar devices utilize photons having an amount of energy for exciting electrons in the semiconductor material from the valence band to the conduction band. This establishes the power conversion efficiency (PCE) limit of single junction PV and can result in unwanted photo-to-heat conversion in PV devices.

In order to enhance performance aspects such as power conversion efficiency, embodiments relate to photovoltaic devices having a tandem structure. According to a tandem PV approach, multiple semiconductor materials absorb photons having different energies.

In a two-junction tandem solar cell, top and bottom cells are deployed to collect photons from different portions of the solar spectrum. Generally, the semiconductor materials of the top cell have a larger bandgap. For example, when forming tandem structure with silicon cell, the semiconducting materials of top cell have bandgap larger than 1.1 eV. Typically, the semiconducting materials of top cell have bandgap between 1.2-1.9 eV. More typically, the seminconduting materials of top cell have bandgap between 1.6-1.8 eV. This results in absorption of photons with higher energies, allowing low energy photon to pass through.

By contrast, the semiconductor materials of the bottom cell have a smaller bandgap. Generally, the semiconducting materials of bottom cell have bandgap smaller than 2.0 eV (e.g., between about 2.0 eV and 1.0 eV) to absorb more infrared range photons. Typically, the semiconducting materials of bottom cell have bandgap smaller than 1.5 eV. More typically, the semiconducting materials of bottom cell have bandgap smaller than 1.2 eV. This results in absorption of photons with lower energies by the narrow-bandgap semiconductor materials in the bottom cell.

Figure 1:
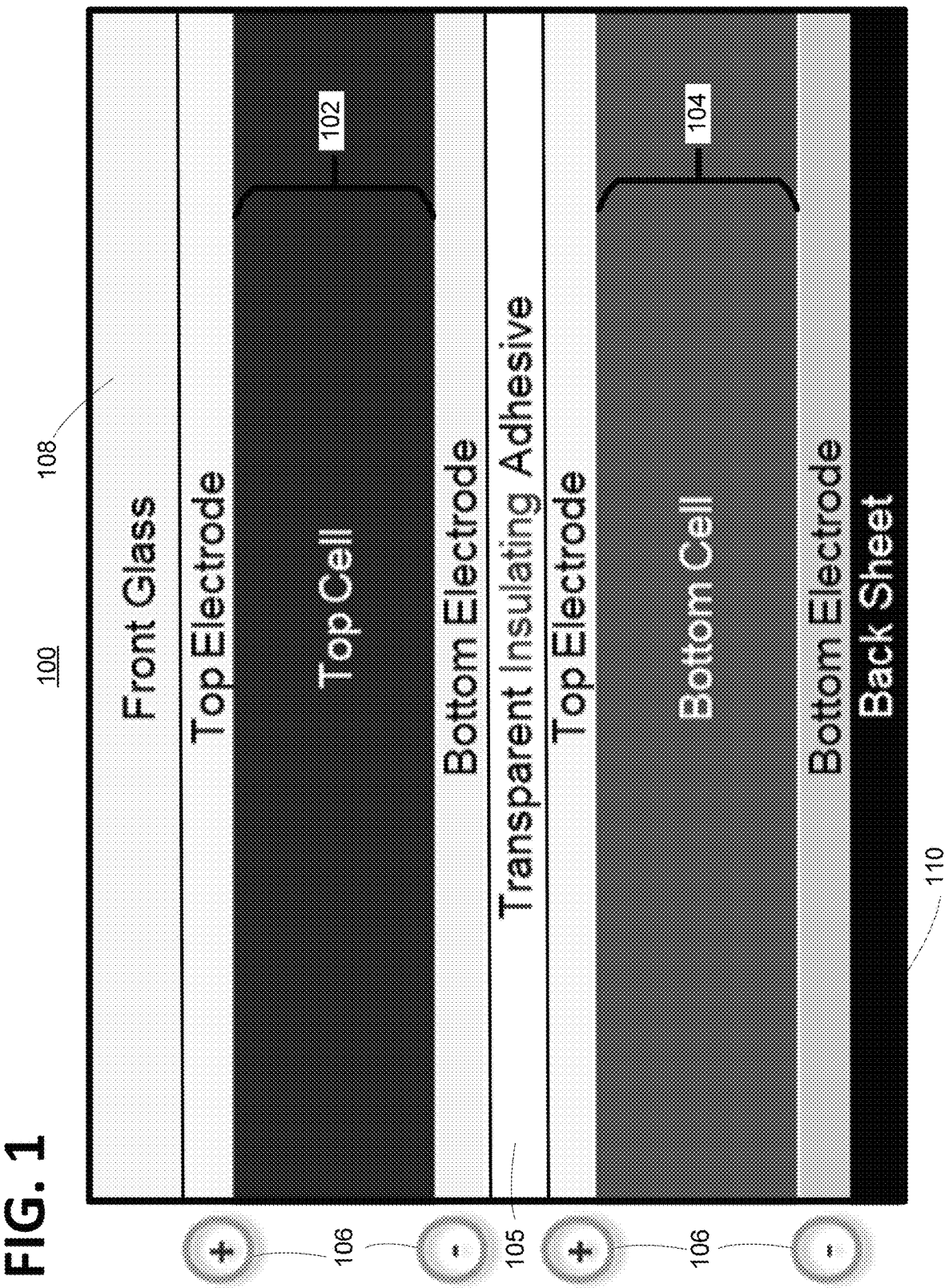
FIG. 1 shows a simplified cross-section of a tandem solar device according to an embodiment.

FIG. 1 shows a simplified view of a mechanically stacked tandem PV structure 100 according to an embodiment. According to such an architecture, the assembly including the top cell 102 and corresponding electrodes, and the assembly including the bottom cell 104 and corresponding electrodes, are independent. The top and bottom cell assemblies are bonded together utilizing a transparent insulating adhesive 105.

Thus, there are four electrodes 106 connected to an external circuit. For this reason, a mechanically stacked tandem structure may also be referred to as a four-terminal tandem.

According to embodiments, all but the bottom electrode may be at least partially transparent to certain wavelengths of incoming (solar) light. Thus, one or more of the electrodes may be fabricated from a Transparent Conducting Oxide (TCO), examples of which can include but are not limited to Indium Tin Oxide (ITO), Fluorine Doped Tin Oxide (FTO), Aluminium Doped Zinc Oxide (AZO), Indium Doped Zinc Oxide (IZO); one or more of the electrodes may also be fabricated from Ag nanowire film, carbon nanotube film, or conductive polymer film such as Poly(3,4-ethylenedioxythiophene) (PEDOT), Poly(3,4-ethylenedioxythiophene) PEDOT: poly(styrene sulfonate) PSS.

It is emphasized that the cross-sectional view of the tandem PV structure of FIG. 1 is provided for illustrative purposes only. For example, certain layers may actually comprises stacks of different layers.

Moreover, neither FIG. 1 nor the other cross-sectional views discussed below, are depicted as being strictly to scale. Thus (as one possible example only), the relative thicknesses of various constitutents are listed below.

| Element | Ref. No. | Exemplary Thickness (μm) |
|---|---|---|
| Front Glass | 108 | 1-3200 |
| Electrodes | 106 | 0.01-10 |
| Top Cell | 102 | 0.01-100 |
| Adhesive | 105 | 0.1-500 |
| Bottom Cell | 104 | 0.01-500 |
| Back Sheet | 110 | 0.1-10 |

According to the particular embodiment of FIG. 1, it is noted that the top and bottom cells are not separately encapsulated. That is, encapsulation at the top of the entire tandem PV device is afforded by the front glass 108. Encapsulation at the bottom of the entire tandem PV device is afforded by the back sheet 110. Either one or both of the front glass and the back sheet could include a Through-Substrate-Via (TSV).

By contrast, typically in four terminal tandem PV structures the top and bottom cells are separately encapsulated. However, such a conventional fabrication structure and fabrication process can potentially offer certain drawbacks.

One drawback is to increase the cost of a solar module. Such increased cost may be attributable at least to the consumption of materials used for the separate encapsulation, as well as increased complexity of assembly.

Moreover, employing a separate encapsulation approach for cells at different depths can adversely result cause more optical loss at resulting interfaces. This reduces the overall efficiency of the tandem PV device.

Finally, the inclusion of a separate insulating substrate for use in fabricating the upper cell, can increase a total weight of a solar module. This can be particulary undesirable insofare as regulations may impose strict limits on the weight of a module that may safely be handled and installed by hand (rather than requiring a crane).

In order to avoid one or more of these drawbacks, embodiments offer a tandem PV cell configuration in which a top cell is directly fabricated on a front glass, without requiring a separate transparent substrate. Such a configuration can desirably eliminate at least two layers:
  a separate transparent substrate (such as glass) used to fabricate an upper solar cell; and
  a transparent adhesive layer between the front glass and the top cell.

Moreover, a tandem PV architecture according to embodiments can also result in the elimination of multiple interfaces, and avoidance of any optical losses attendant thereto:
  1) a first interface between the front glass and a transparent adhesive;

2) a second interface between the transparent adhesive and a top electrode of top cell;
3) a third interface between a bottom electrode of a top cell and a transparent substrate upon which the top cell was fabricated; and
4) a fourth interface between the transparent substrate upon which the top cell was fabricated, and transparent insulating adhesive.

Accordingly, embodiments of tandem PV devices can offer the benefits of one or more of reducing optical loss (and inefficiency), the total weight, and the cost of materials.

Figure 2:
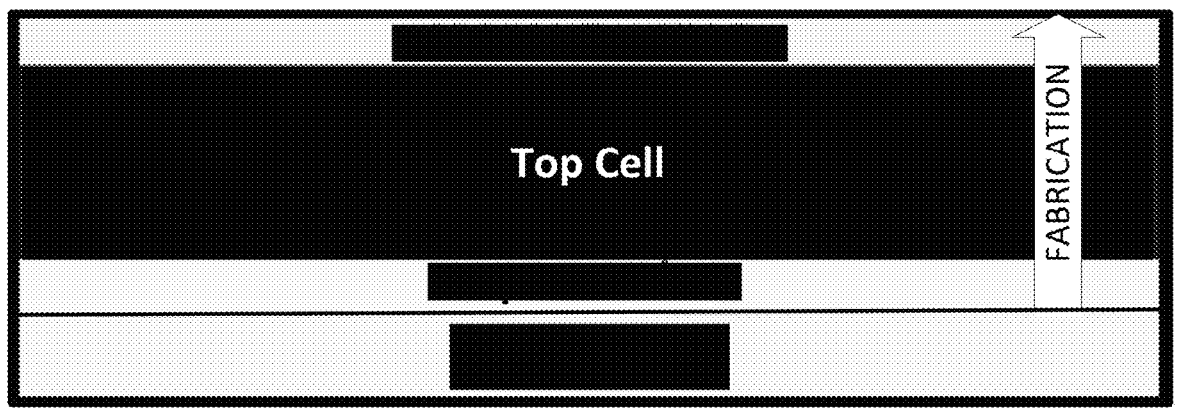
FIG. 2 shows the fabrication of a top cell of the tandem device of FIG. 1.

FIG. 2 shows the fabrication of a top cell of the tandem device of FIG. 1. First, the front glass is provided as a substrate upon which fabrication of the top cell is to be performed.

The front glass has thickness of 1-3200 μm. Typically, it has thickness of 50-3200 μm. More typically, it has thickness of 200-3200 μm. The optical transmittance of the front glass is at least 85%. Typically, the optical transmittance of the front glass is at least 90%.

Then, starting with the front glass, the corresponding top electrode is first formed, followed by the top cell and the corresponding bottom electrode. The top electrode can be formed by Chemical Vapor Deposition (CVD), Physical Vapor Deposition (PVD), or Atomic Layer Deposition (ALD) techniques. The top electrode could be formed by a solution-based coating process such as spray coating, dip coating, slot-die coating, or blade coating.

Materials of top electrodes can be selected from Transparent Conducting Oxide (TCO), examples of which can include but are not limited to Indium Tin Oxide (ITO), Fluorine Doped Tin Oxide (FTO), Aluminium Doped Zinc Oxide (AZO), Indium Doped Zinc Oxide (IZO).

One or more of the electrodes could be fabricated from an Ag nanowire film, a carbon nanotube film, or a conductive polymer film such as Poly(3,4-ethylenedioxythiophene) (PEDOT), Poly(3,4-ethylenedioxythiophene) PEDOT: poly (styrene sulfonate) PSS.

Figure 3:
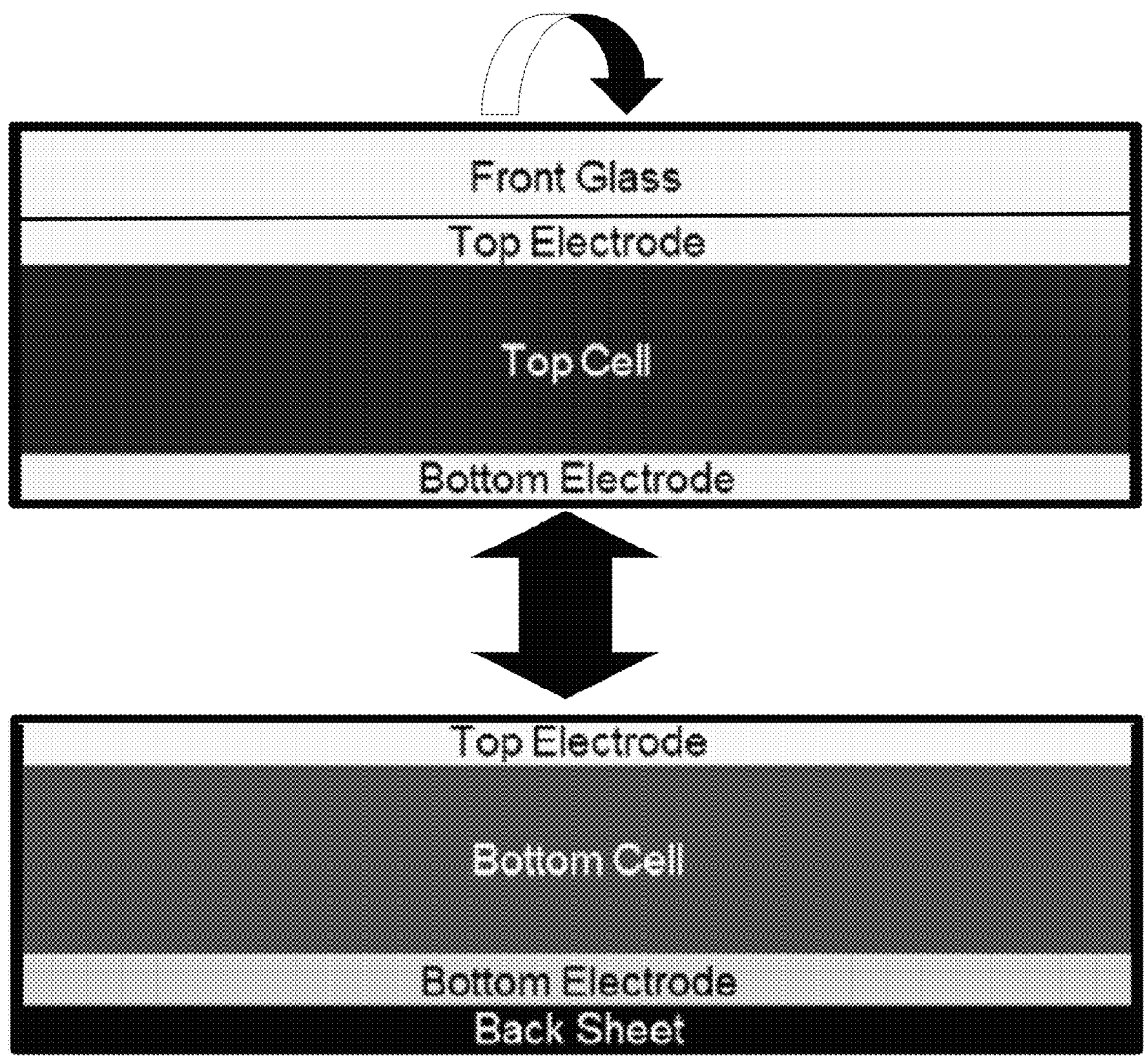
FIG. 3 shows the assembly of the top cell and a bottom cell to form the tandem device of FIG. 1.

FIG. 3 shows the next step, wherein construction of the tandem PV device of FIG. 1 is completed. In particular, first the assembly including the fabricated top cell of FIG. 2 is turned upside down.

Figure 4:
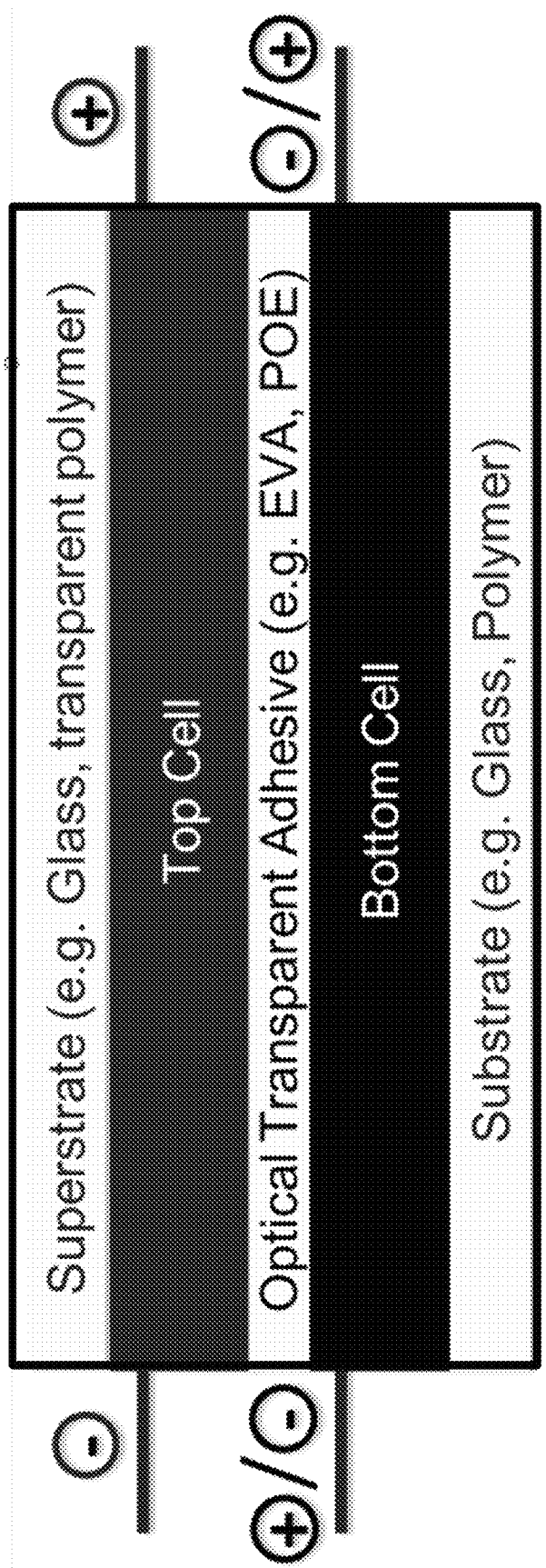
FIG. 4 shows a generalized cross-sectional view of a tandem solar device according to an embodiment.

Then, the inverted top assembly, is bonded directly to the assembly including the bottom cell (e.g., utilizing a layer of adhesive). FIG. 4 shows a simplified generalized view of the resulting tandem structure. Typically the adhesive can be encapsulant such as ethylene vinyl acetate (EVA) or polyolefin (POE). Both EVA and POE exhibit durability, adhesive bonding properties, and high transparency. These materials can provide protection on the cells and circuits from shocks and vibration. The adhesive can also be an electrically insulating adhesive such as an epoxy-based adhesive.

Figure 5:
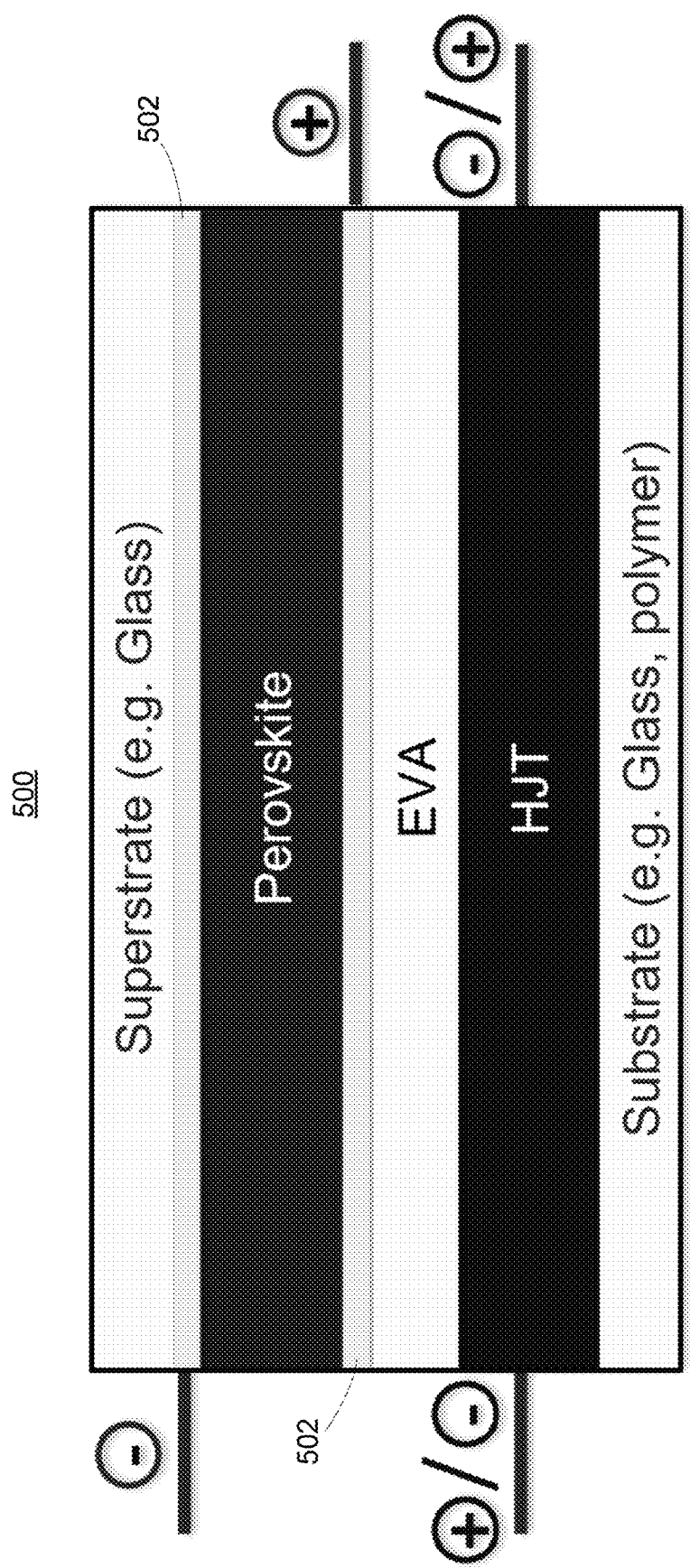
FIG. 5 shows one example of a tandem solar device according to an embodiment.

FIG. 5 shows one specific example of a tandem solar device 500 according to an embodiment. Here, the top absorbing PV cell structure is of a perovskite design, while the bottom absorbing PV cell structure is of a heterojunction (HJT) design.

Optical transparent transporting layer/functional layers/electrodes 502 are shown. These can comprise but are not limited to:
1) electrodes,
2) electrodes and transporting layers,
3) electrodes, transporting layers, and passivation layers,
4) electrodes, transporting layers, passivation layers and back-transfer blocking layer, or
5) electrodes, transporting layers, passivation layers, back-transfer blocking layers, in-situ barrier layers.

Layers other than the electrodes themselves are optional, but they can help improve the performance.

It is noted that there are two types of transporting layers: a hole transporting layer, and an electron transporting layer. A hole transporting layer is used to provide electrical communication with a positive electrode. An electron transporting layer is used to provide electrical communication with a negative electrode.

While the specific embodiment of FIG. 5 shows perovskite as the top cell in a tandem device, this is not required. Perovskite may exhibit a wide range of bandgap (typically varying from about <0.9 eV to >3.5 eV) depending on its composition. So, depending upon bandgap of perovskite materials used, some embodiments could comprise bottom cell perovskite, or perovskite-perovskite tandem devices.

Figure 6:
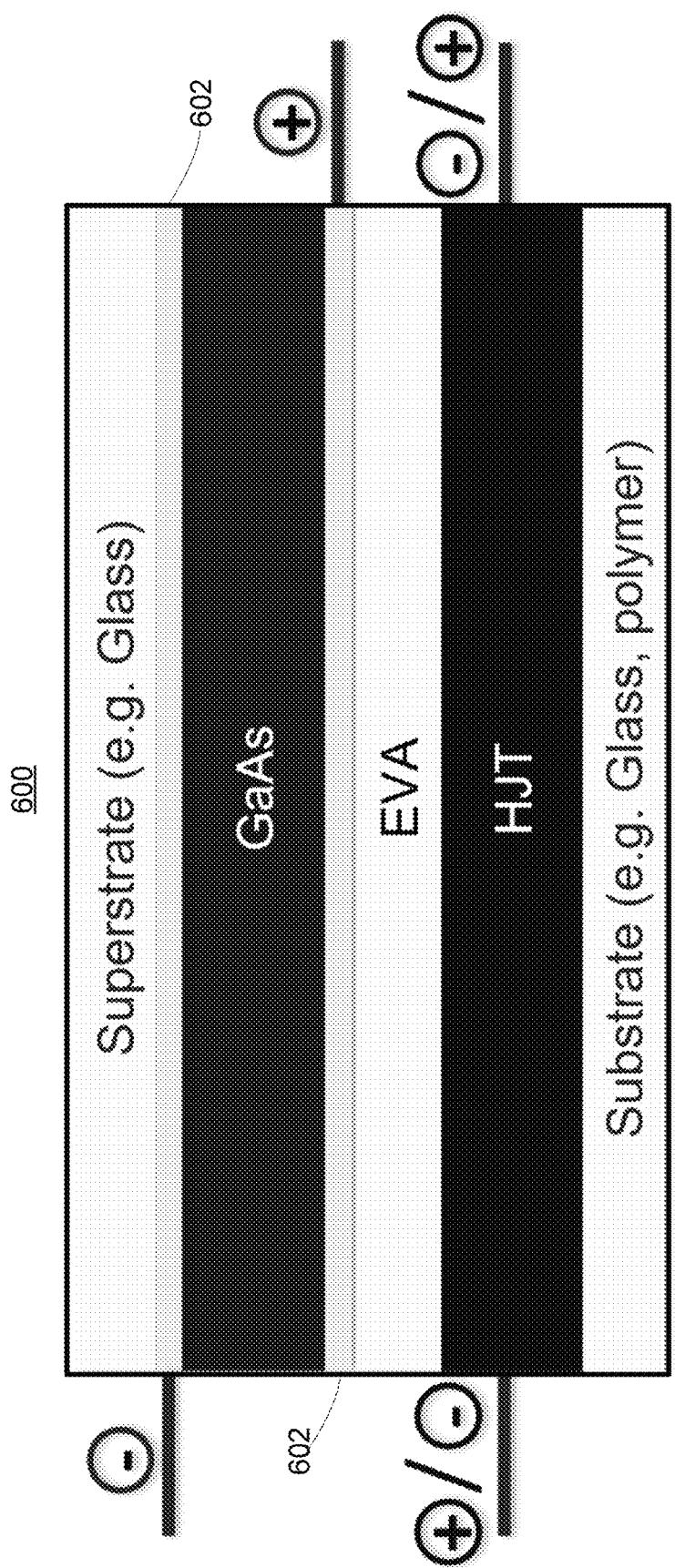
FIG. 6 shows another example of a tandem solar device according to an embodiment.

FIG. 6 shows another specific example of a tandem solar device 600 according to an embodiment. Here, the top absorbing PV cell structure is of a GaAs design, while the bottom absorbing PV cell structure is of the HJT design.

FIG. 6 again shows optical transparent transporting layer/functional layers/electrodes 602. These layers can comprise but are not limited to:
1) electrodes,
2) electrodes and charge transporting layers/charge extraction layer,
3) electrodes, charge transporting layers/charge extraction layer, and passivation layers,
4) electrodes, charge transporting layers/charge extraction layer, passivation layers and back-transfer blocking layer, or
5) electrodes, transporting layers, passivation layers, back-transfer blocking layers, in-situ barrier layers.

Apart from the conducting electrodes themselves, other functional layers are optional but can help to improve the performance.

It is noted that there are different types of charge transporting layers/charge extraction layer: hole transporting layers/hole extraction layer and electron transporting layer/electron extraction layer. A hole transporting layer/extraction layer is used to provide electrical communication with a positive electrode. An electron transporting layer/extraction layer is used to provide electrical communication with a negative electrode.

A solar device can comprise a variety of different cell designs for both the top and the bottom. Examples can include but are not limited to:
Silicon PV;
Halide perovskite PV (e.g. $CsPbI_{3-x}Br_x$, $0 \leq x \leq 3$);
III-V PV (e.g. GaAs);
organic PV;
polymer PV;
quantum dot-based PV;
carbon nanotube PV;
copper indium gallium selenide (CIGS) PV and its derivatives, e.g., $Cu(In_{1-x}Ga_x)Se S$, $0 \leq x \leq 1$;
copper zinc tin sulfide (CZTS) PV
cadmium telluride (CdTe) PV and its derivatives, e.g., CdS and CdSe PV; and
other thin-film PV.

While the above has shown tandem solar devices having electrical contacts on both sides of both cells, this is not required. According to certain embodiments, one or both of the cells could have electrical contacts on one side only.

Figure 7:
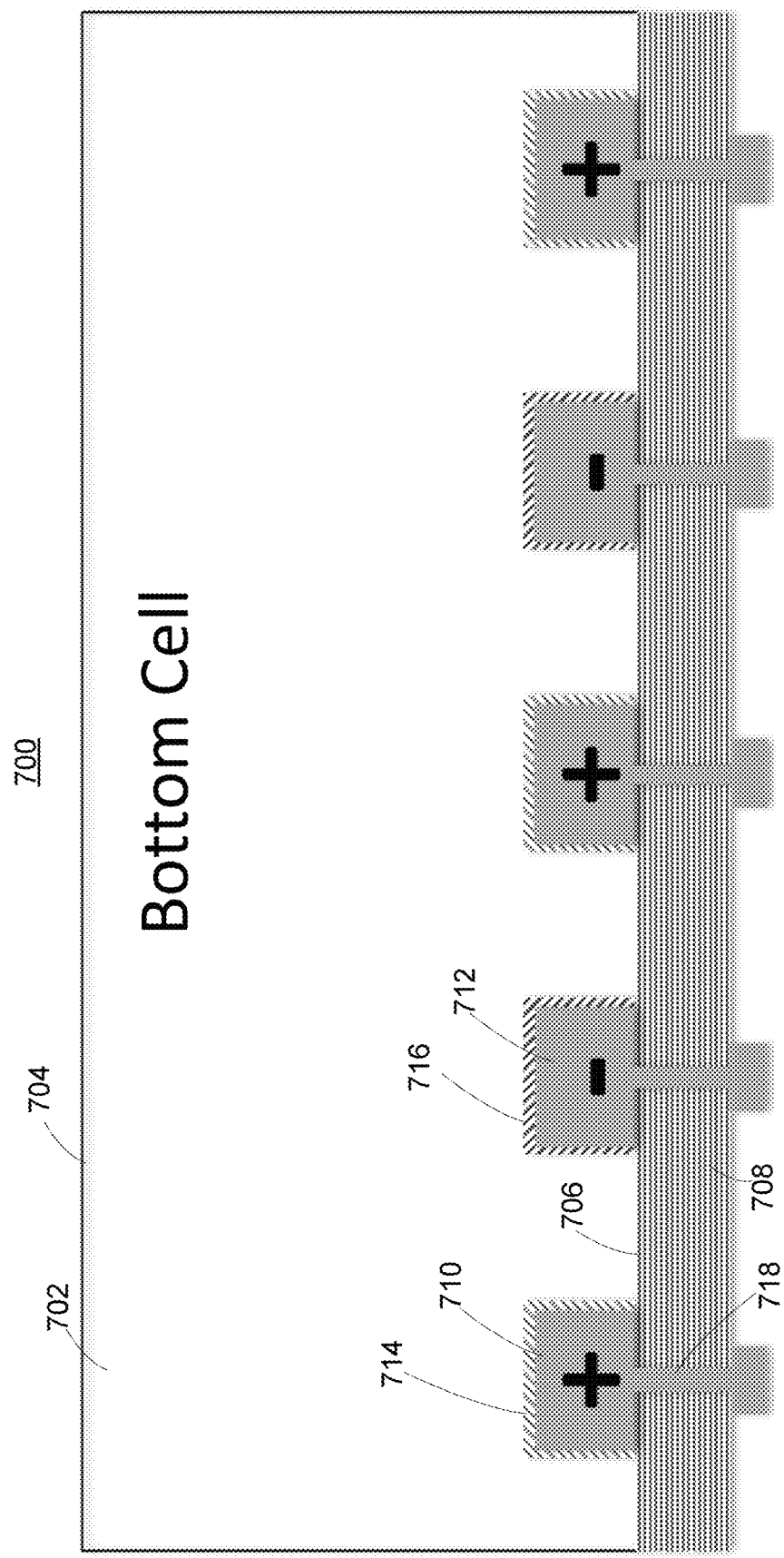
FIGS. 7-10 show examples of back-contact tandem solar device according to embodiments.

For example, FIG. 7 shows one back-contact cell of a solar device 700 according to an embodiment. Perovskite PV cell 702 includes a front side 704 facing toward incident light to be collected.

The back side 706 is supported on substrate 708. The back side includes positive electrodes 710 and negative electrodes 712.

Hole transporting material 714 provides an interface between the positive electrodes and the perovskite layer. Electron transporting material 716 provides an interface between the negative electrodes and the perovskite layer.

As shown, the positive and negative electrodes project through vias 718 that are formed in the substrate. Such vias may be TSVs as described herein.

While the particular embodiment of FIG. 7 specifically shows the back-contact solar cell as the bottom cell of a tandem device, this is not required. Alternative embodiments could employ a back-contact cell alone or as a top cell in a tandem device.

Figure 8:
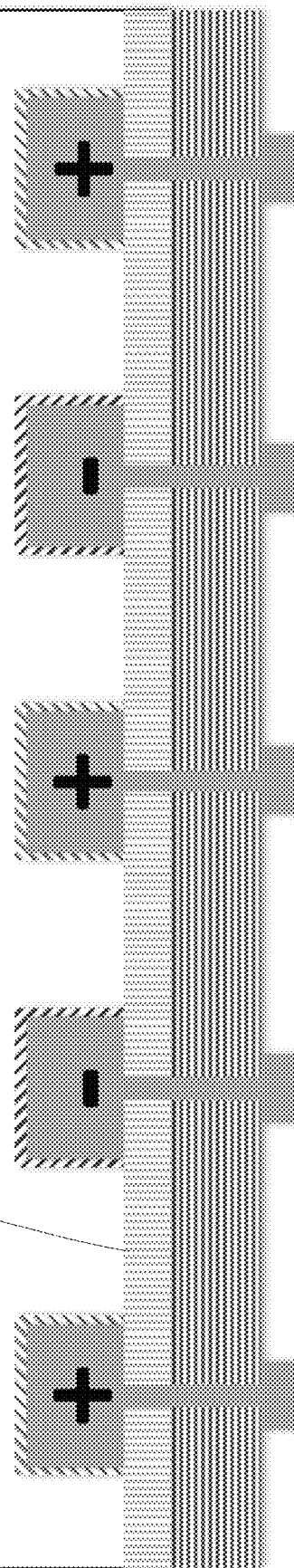

FIG. 8 shows another example of a back-contact tandem solar device 800 according to an embodiment. This device is similar to that of FIG. 7, except an insulating layer 802 is present between the back side of the perovskite layer and the substrate.

Figure 9:
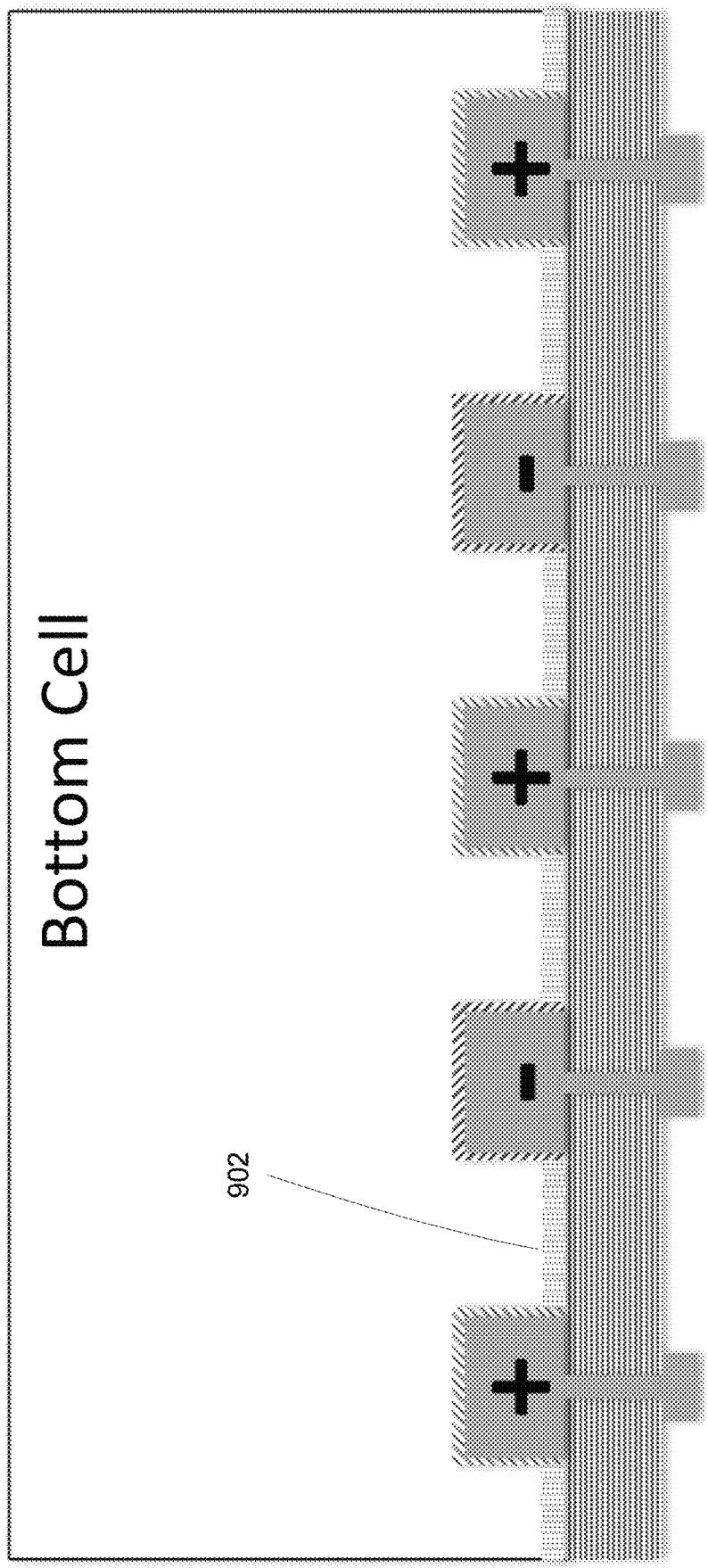

FIG. 9 shows still another example of a back-contact tandem solar device 900 according to an embodiment. This device is similar to that of FIG. 8, except insulating material 902 is present between the electrodes on the back side of the perovskite layer. This can further separate the hole and electron transporting layer and prevent any recombination.

Figure 10:
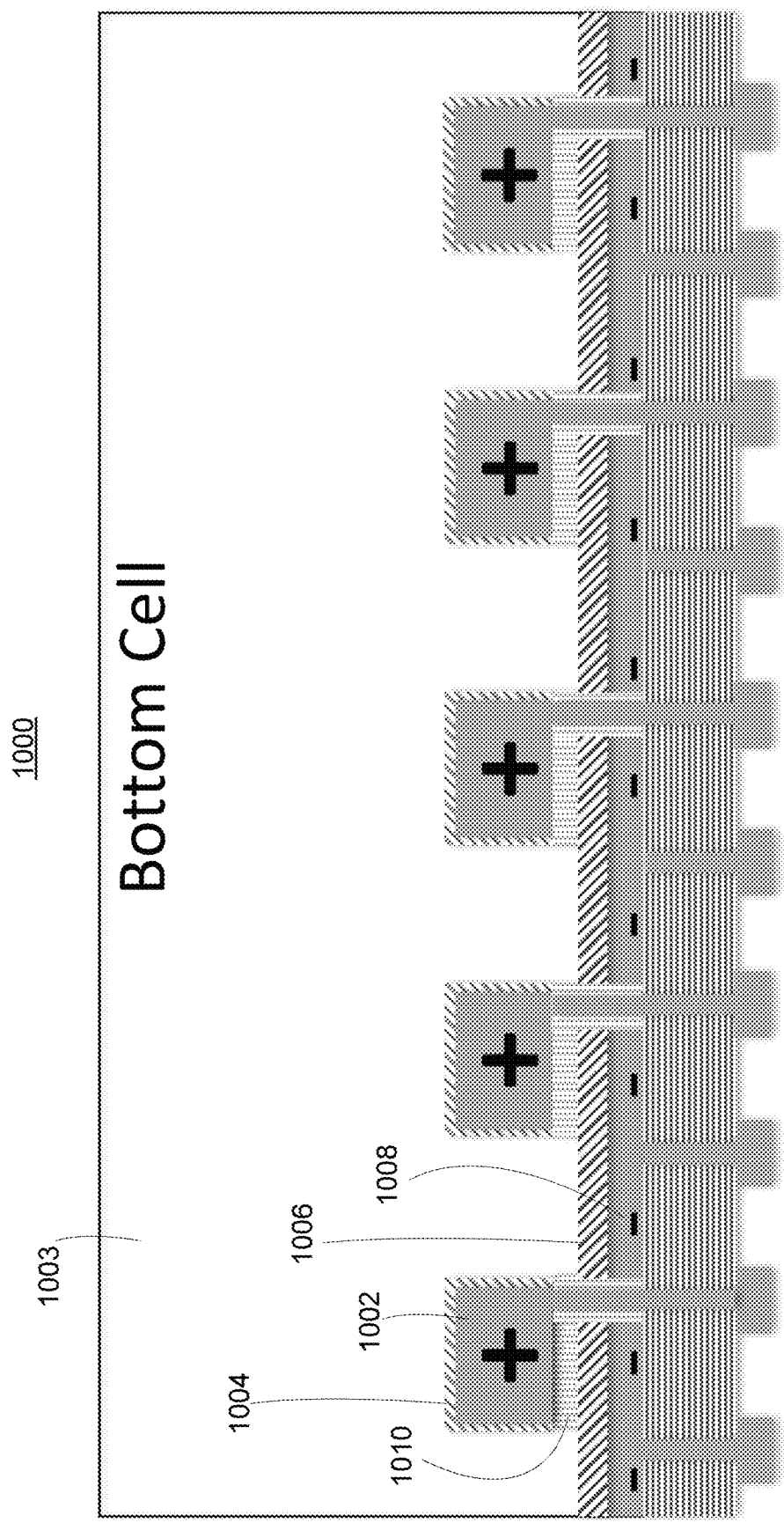

FIG. 10 shows yet another example of a back-contact tandem solar device 1000 according to an embodiment. This architecture is similar to that of FIG. 8, except that only the positive electrodes 1002 are embedded in the back side of the perovskite layer 1003 (and in electronic communication therewith through the hole transporting material 1004).

The electron transporting material 1006 and negative electrode 1008 covers the entirety of the back side of the perovskite layer. The positive electrode and hole transporting material are separated from the negative electrode and the electron transporting material, by an insulating layer 1010.

In some embodiments, a multi-layer structure comprising a conductive layer in contact with at least one insulating layer, can be utilized. Certain embodiments may feature two conductive surfaces that sandwich an insulating core layer.

Figure 15:
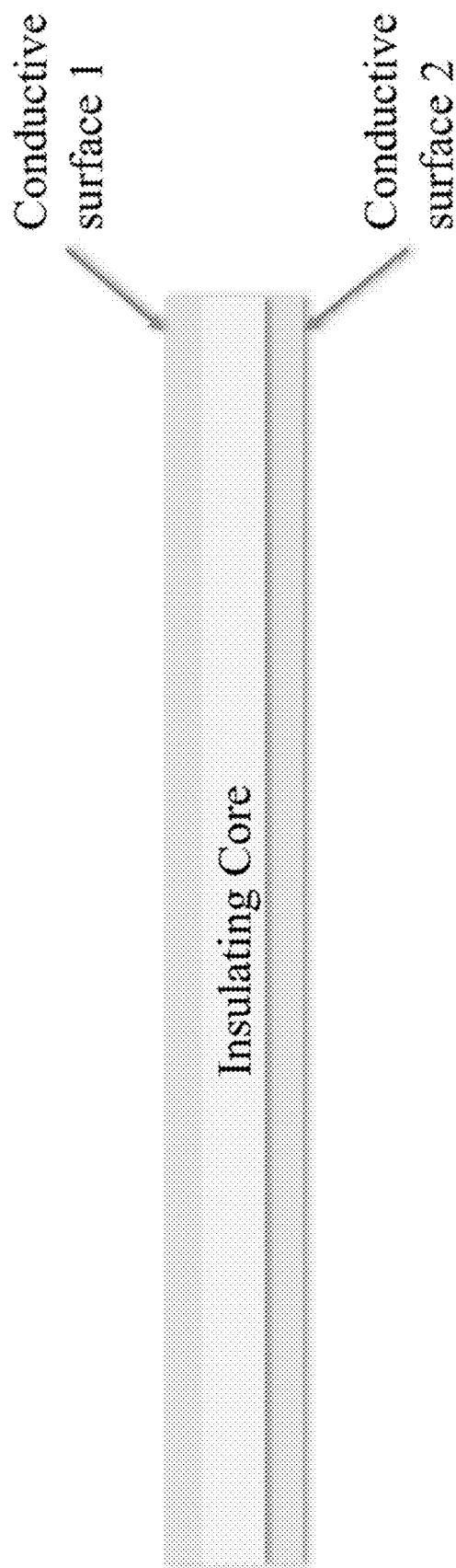
FIG. 15 shows a simplified cross-sectional view of a multi-layer structure comprising conductive layers sandwiching an insulating core.

Some such embodiments can utilize the conductive layers to replace electrodes of both top and bottom cells facing to the middle of tandem structure. FIG. 15 shows a simplified cross-sectional view of a multi-layer structure according to an embodiment.

Figure 16:
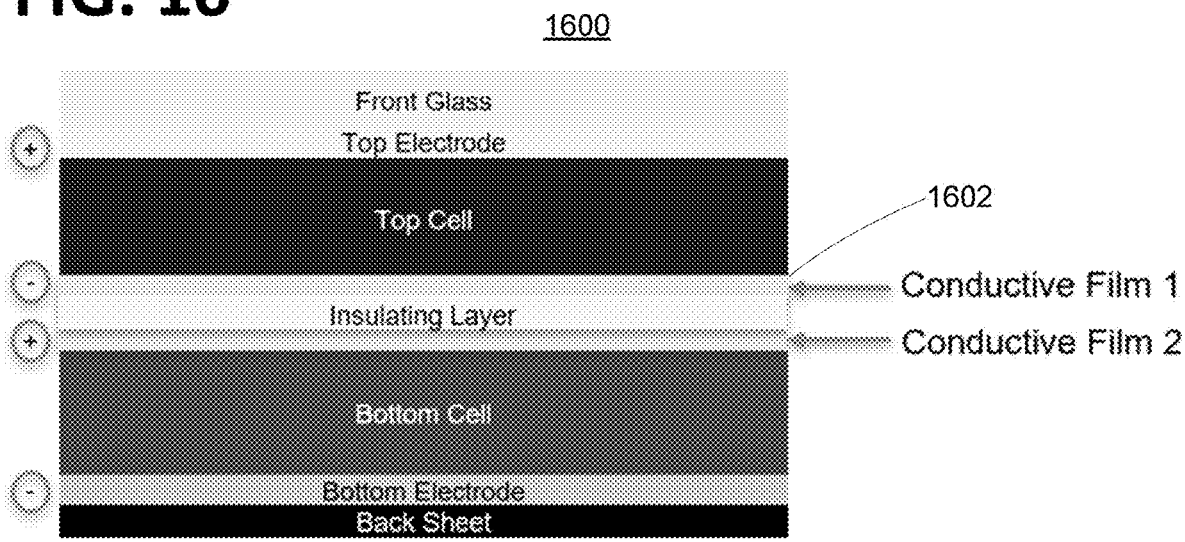
FIG. 16 shows a simplified cross-sectional view of an embodiment of a tandem device featuring a multi-layer structure.

The multi-layer structure integrates the conductive film(s) and insulting layer together, so that it can be used in a tandem structure to connect to an electrode of the top and the bottom cell, as shown in the simplified cross-sectional view of FIG. 16.

While the particular embodiment 1600 of FIG. 16 shows only a single multi-layer structure 1602, other embodiments could utilize more than one multi-layer structures. For example, the specific embodiment 1700 of FIG. 17 shows a simplified cross-section of a tandem PV device featuring a first multi-layer structure 1702 between the top and bottom cells, and also featuring a second multi-layer structure 1704 as part of the top encapsulating substance of the tandem device.

Figure 17:
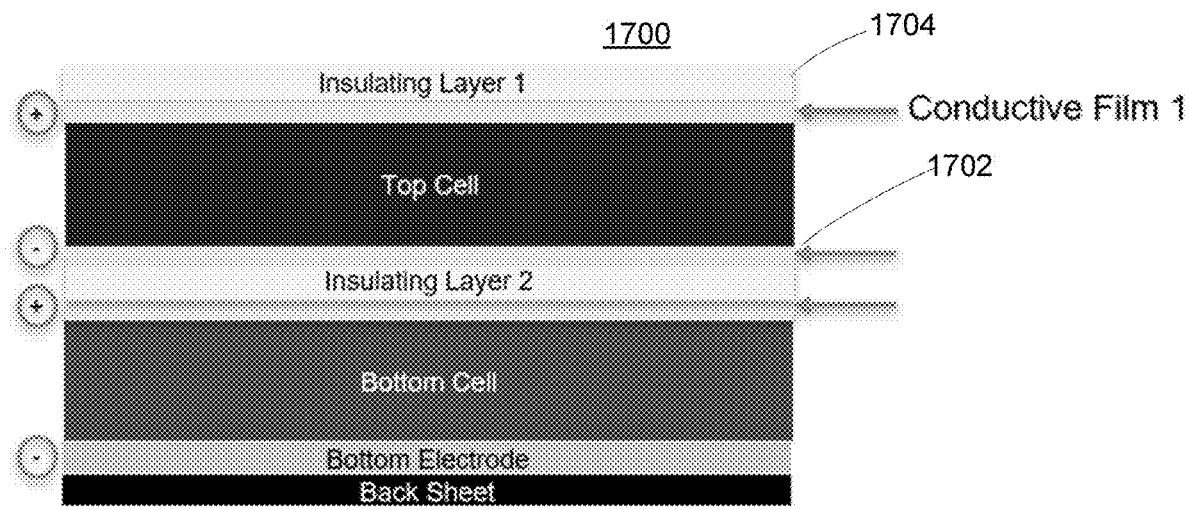
FIG. 17 shows a simplified cross-sectional view of an embodiment of a tandem device featuring a multi-layer structure.

In the embodiment of FIG. 17, the first multi-layer structure comprises a three-layer sandwich as described above. The second multi-layer structure comprises only one single conductive film.

FIG. 18 shows a simplified cross-sectional view of another embodiment of a tandem PV device featuring three different multi-layer structures. FIG. 19 shows a simplified cross-sectional view of still another embodiment of a tandem PV device featuring only one multi-layer structure, where the insulating layer comprises a top encapsulating substance and a conductive film serves as an electrode.

Figure 20:
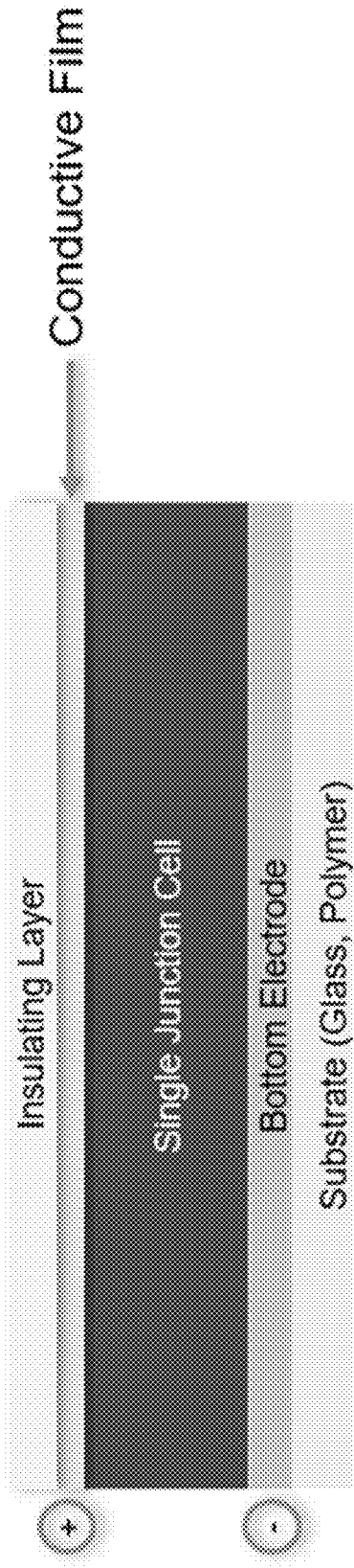
FIG. 20 shows a simplified cross-sectional view of an embodiment of a single cell PV device featuring a multi-layer structure comprising an insulting layer and a conducting layer.
Figure 21:
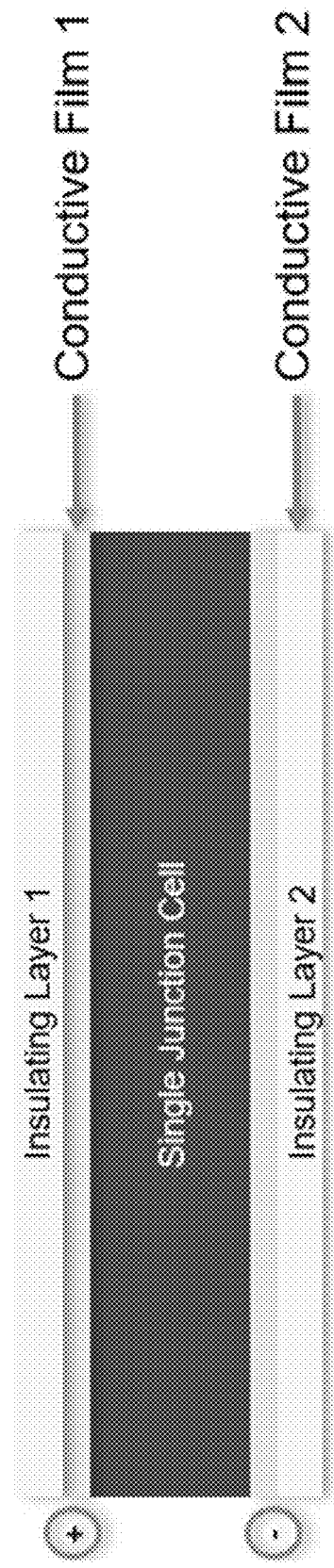
FIG. 21 shows a simplified cross-sectional view of an embodiment of a single cell PV device featuring a multi-layer structure comprising an insulting layer and a conducting layer.

Multi-layer structures according to embodiments are not limited to use in tandem PV devices. FIG. 20 shows a simplified cross-sectional view of a single cell PV device where a multi-layer structure serves as a top encapsulating material. FIG. 21 shows a simplified cross-sectional view of a single cell PV device where separate multi-layer structures serve as the top and bottom encapsulating materials.

According to some embodiments, the conductive layer of a multi-layer structure can partially or completely replace electrode(s) to simplify the fabrication process, reduce the manufacturing cost, and improve the PV performance. The conductive film can provide terminals for electrical connection.

The conductive film can be made with one or more of the following:
1) conductive polymer, e.g., polyacetilene, polyaniline, polypyrrole;
2) conductive nanoparticles, e.g., $SnO_2$, ZnO, Al-doped ZnO, In-doped ZnO, Ag;
3) mixture of polymer and nanoparticles (either or both of these two components can be conductive).

The insulating layer can be one or more of:
polymer, e.g. polyethylene terephthalate, polyethylene, or inorganic materials, e.g. glass.

It is noted that in certain embodiments, the insulating layer can be transparent.

According to particular embodiments, the conductive film can be adhesive. A multi-layer structure comprising tape/adhesive could be patterned accordingly. In some embodiment, the tape/adhesive can be flexible or non-flexible.

In some embodiment, the tape/adhesive can have conductive film on only one side. Such tape/adhesive can be used as a top encapsulating substance, a bottom encapsulating substance, or both.

Clause 1A. A method comprising:
providing a thin insulating substrate;
forming a first transparent electrode upon the thin insulating substrate;
fabricating a first photovoltaic (PV) cell upon the first electrode, the first PV cell having a first band gap;
forming a second transparent electrode upon the first PV cell; and
bonding the second transparent electrode to a third electrode of a second PV cell, the second PV cell having a smaller bandgap than the first bandgap.

Clause 2A. A method as in clause 1A further comprising forming a tandem PV cell from the first PV cell and the second PV cell.

Clause 3A. A method as in clause 2A wherein the tandem PV cell is a four electrode device.

Clause 4A. A method as in clause 1A wherein the second PV cell is a hetero junction (HJT) PV cell.

Clause 5A. A method as in clause 1A wherein the first PV cell is selected from a perovskite PV cell, an organic PV cell, a polymer PV cell, or a quantum-dot PV cell.

Clause 6A. A method as in clause 1A wherein the first PV cell comprises silicon.

Clause 7A. A method as in clause 1A wherein the first PV cell comprises GaAs.

Clause 8A. A method as in clause 1A wherein the thin insulating substrate comprises glass.

Clause 9A. A method as in clause 8A wherein the glass has a thickness of between about 1-3200 µm.

Clause 10A. A method as in clause 1A wherein the thin insulating substrate comprises a plastic.

Clause 11A. A method as in clause 10A wherein the plastic has a thickness of between about 10-1000 µm.

Clause 12A. A method as in clause 1A wherein the bonding utilizes a transparent insulating adhesive material.

Clause 13A. A method as in clause 1A wherein at least one of the first electrode, the second electrode, and the third electrode comprise a Transparent Conducting Oxide (TCO).

Clause 14A. A method as in clause 11A wherein the TCO comprises Indium Tin Oxide (ITO).

Clause 15A. A method as in clause 1A wherein the first PV cell comprises silicon.

Clause 16A. A method as in clause 1A wherein the first PV cell comprises GaAs.

Clause 17A. A method as in clause 1A wherein the thin insulating substrate comprises glass.

Clause 18A. A method as in clause 1A wherein the thin insulating substrate comprises a plastic.

Clause 19A. A method as in clause 1A wherein the bonding utilizes a transparent insulating adhesive material.

Clause 20A. A method as in clause 1A wherein at least one of the first electrode, the second electrode, and the third electrode comprise a Transparent Conducting Oxide (TCO).

Clause 15A. An apparatus comprising:
a thin front insulating transparent substrate;
a first transparent electrode in direct contact with the thin front insulating transparent layer;
a first photovoltaic (PV) cell having a first bandgap in direct contact with the first transparent electrode;
a second transparent electrode on a side of the first PV cell opposite to the first transparent electrode; and
a third transparent electrode of a second PV cell bound to the second transparent electrode through a transparent insulating adhesive, wherein the second PV cell has a smaller bandgap than the first bandgap.

Clause 16A. An apparatus as in clause 15A wherein the transparent insulating adhesive is selected from ethylene vinyl acetate (EVA) or polyolefin (POE).

Clause 17A. An apparatus as in clause 15A wherein the second PV cell comprises a hetero-junction (HJT) cell.

Clause 18A. An apparatus as in clause 15A wherein the first PV cell is selected from a perovskite PV cell, a polymer PV cell, an organic PV cell, or a quantum-dot PV cell.

Clause 19A. An apparatus as in clause 15A wherein the thin transparent substrate comprises glass or plastic.

Clause 20A. An apparatus as in clause 19A wherein the thin transparent substrate comprises glass having a thickness of between about 1-3200 µm.

Certain embodiments relate to an interconnection configuration for optoelectronic devices utilizing an insulating substance as substrate, and a method of fabricating said interconnect. Specific embodiments introduce a Through-Substrate-Via (TSV) structure that extends through an insulating substrate in order to provide contact with an opposite side (e.g., back electrode) of a solar device—which may or may not be a tandem PV cell. Certain embodiments may find particular use in optoelectronic applications that call for high light transmittance in multi-layered structures. More specifically, certain embodiments featuring TSVs according to embodiments may be employed in making shingled perovskite photovoltaic solar cells.

Figure 11:
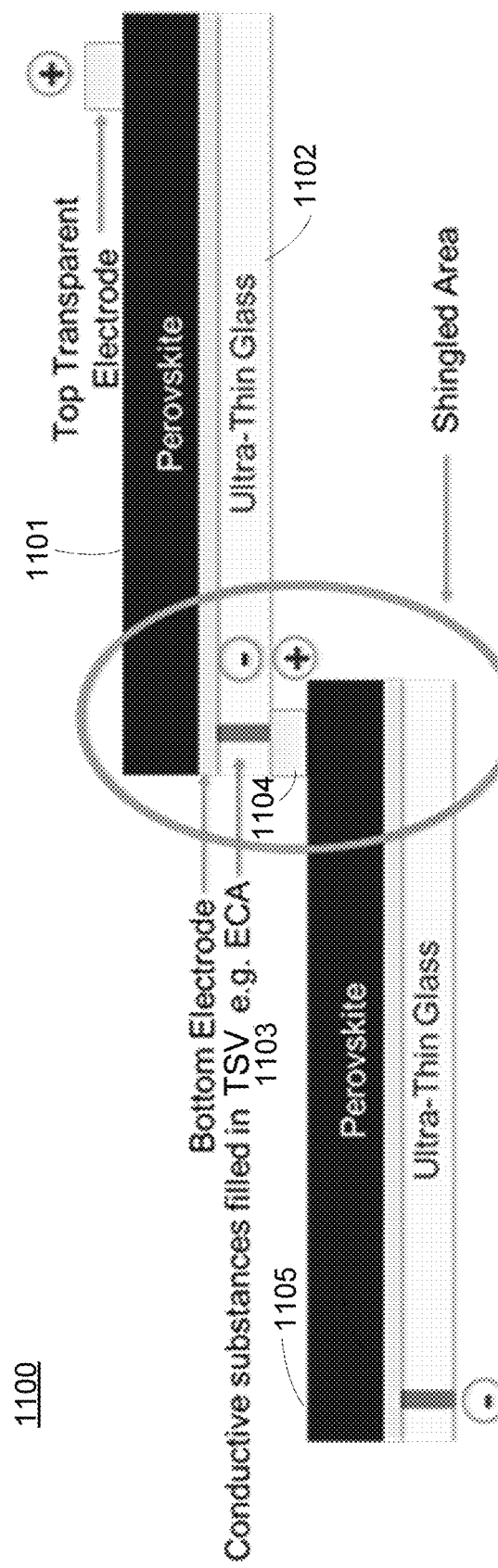
FIG. 11 shows a simplified cross-sectional view of an embodiment of a shingled solar device utilizing TSVs.

FIG. 11 shows a simplified cross-sectional view of an embodiment of an architecture 1100 comprising overlapped solar devices including TSV structures. In particular, a first perovskite-based PV solar cell 1101 is fabricated on a thin glass 1102 that serves as an insulating substrate.

In particular, such ultra-thin glass has Through-Substrate-Vias 1103 that are filled with electrically conductive substance(s)—e.g. electrically conductive adhesive (ECA). These filled vias form an electrical interconnection with the top transparent electrode 1104 of the overlapped (e.g., in a shingled manner) second perovskite-based PV solar cell 1105.

A process 1200 for fabricating the structure shown in FIG. 11, is summarized in the flow diagram of FIG. 12. Also, FIG. 13 shows simplified cross-sectional views of that fabrication process for making an interconnection configuration for optoelectronic devices using an insulating substance as substrate.

In particular, at 1202 clean substrates 1300 comprising electronically insulating material are provided. In certain embodiments, the insulating material is glass. According to particular embodiments, the glass is ultra-thin glass having a thickness below 1 mm, more typically below 0.5 mm, and possibly 0.05 mm or even thinner.

However, the substrate is not limited to glass, and could also be other materials such as plactic. A typical thickness for a plastic (e.g., polyethylene, polyethylene terephthalate) substrate can be <0.5 mm.

The substrate may be clean, in that contamination and/or particles may be removed from the substrate surface. This cleanliness may be valuable for obtaining a high quality film deposited onto the substrate.

Pre-TSV actions can be selected from the following processes or their combination:
1) cleaning with water, solvent, UV-Ozone or plasma;
2) chemical/mechanical polishing to make the surface more flat/smooth for deposition;
3) texturing to trap more light and reduce reflection;
4) surface treatment (e.g. UV-Ozone or plasma) to adjust surface energy for better coating/deposition quality.

The sequence of these steps can be adjusted according to the process requirement.

Post TSV actions can be selected from the following processes or their combination:
1) cleaning with water, solvent, or plasma;
2) chemical/mechanical polishing to make the surface (including the surface of vias) more flat/smooth for deposition;
3) texturing to trap more light and reduce reflection;
4) surface treatment (e.g. UV-Ozone or plasma) to adjust surface energy for better coating/deposition quality.

The sequence of these steps can be adjusted according to the process requirement.

At 1204, the TSV process is performed to create a TSV 1302 in the substrate. For glass, the TSV may be formed by using a laser, either alone or laser followed by chemical etching—e.g., laser induced deep etching (LIDE). The feature size can be controlled by this process.

In particular embodiments, the outer diameter of a via can be equal or lower than 1 mm, with the via dimensions typically larger than 10-100 µm and 0.5 mm or smaller. This beneficially reduces shading effects, and may allow the use of less-expensive laser equipment.

For plastic substrates, the via can be formed by thermal drilling, mechanical drilling, laser drilling, or some combination thereof. A variety of different plastics exhibiting optical transparency, desirable insulating properties, and long-term stability may be eligible candidates for use as a substrate.

At 1206, the bottom electrode 1304 is formed. The bottom electrode can comprise:
- a Transparent Conductive Oxide (TCO) such as Indium Tin Oxide (ITO), Fluorine Doped Tin Oxide (FTO), Aluminium Doped Zinc Oxide (AZO), Indium Doped Zinc Oxide (IZO);
- Ag nanowire film,
- carbon nanotube film,
- conductive polymer film such as Poly(3,4-ethylenedioxythiophene) (PEDOT), Poly(3,4-ethylenedioxythiophene) PEDOT: poly(styrene sulfonate) PSS.

Such materials may be formed by CVD, PVD, ALD and solution-based coating process such as spray coating, dip coating, slot-die coating, and blade coating.

At 1208, an electrically conductive substance 1306 is filled into the vias. This electrically conductive substance contacts the TCO layer. The electrically conductive substance can be opaque, for example metal paste e.g., silver paste, copper paste. The electrically conductive substance can also be transparent, such as ITO nanoparticles, hollow silver nanoparticles.

It is noted that the filling of an electrically conductive substance into the vias can be implemented anytime once the via is formed. Thus according to alternative embodiments, the order of the sequences of 1206 and 1208 could be switched, such that the via is filled (and excess fill material lying outside of the via removed) prior to formation of the bottom electrode.

It is also noted that the formation of the bottom electrode can be combined with the filling of the TSV. That is, the same process of filling the TSV with conducting material can form the bottom electrode.

At 1210, various functional layer(s) may be formed (e.g., deposited) sequentially onto the TCO layer in order to complete fabrication of the device. Examples of such functional layers can include but are not limited to:
- transporting and/or passivation layer(s) 1308,
- an active (absorber) layer 1310—e.g., perovskite,
- a top electrode layer 1312.

Finally, two devices are interconnected by making the contact between the electrically conductive substance within the TSV and the top electrode.

While the above is a full description of the specific embodiments, various modifications, alternative constructions and equivalents may be employed. For example, many different types of glasses having specific optical properties are available for use.

Moreover, embodiments could be drawn to forming TSVs in a variety of different insulating materials, including but not limited to:
- plastics,
- transparent ceramics, for example, yttrium aluminum garnet (YAG), yttrium oxide
- quartz
- mica.

And while the above has focused upon the use of a perovskite structure as the active PV element, embodiments are not limited to such applications. Through-Substrate-Via structures could be employed to establish electrical connection with a variety of electrooptic structures, including but not limited to:
- Silicon PV;
- Halide perovskite PV (e.g. $CsPbI_{3-x}Br_x$, $0 \leq x \leq 3$);
- III-V PV (e.g. GaAs);
- organic PV,
- polymer PV,
- quantum dot-based PV
- carbon nanotube PV
- copper indium gallium selenide (CIGS) PV and derivatives, such as $Cu(In_{1-x}Ga_x)SeS$, $0 \leq x \leq 1$
- copper zinc tin sulfide (CZTS) PV
- cadmium telluride (CdTe) PV and its derivatives, such as CdS and CdSe PV
- other thin-film PV.

Furthermore, while the above figures show solar cells comprising a single active (e.g., perovskite) element, embodiments are not limited to such configurations. Accordingly, alternative embodiments could utilize back connection for tandem cell configurations comprising multiple PV elements.

According to certain embodiments, the TSV concept is applicable to overlapping PV devices to form shingled structures. Such PV devices can comprise single cells, or be tandem in nature. Tandem PV devices can be 4-terminal (4-T) architectures as has been described above.

Alternatively, overlapping tandem PV devices that communicate utilizing a TSV, can comprise monolithic tandem devices with 2-terminal (2-T) architectures (e.g., including a tunneling layer between cells). An exemplary monolithic tandem device is shown in the simplified cross-sectional view of FIG. 14.

Figure 14:
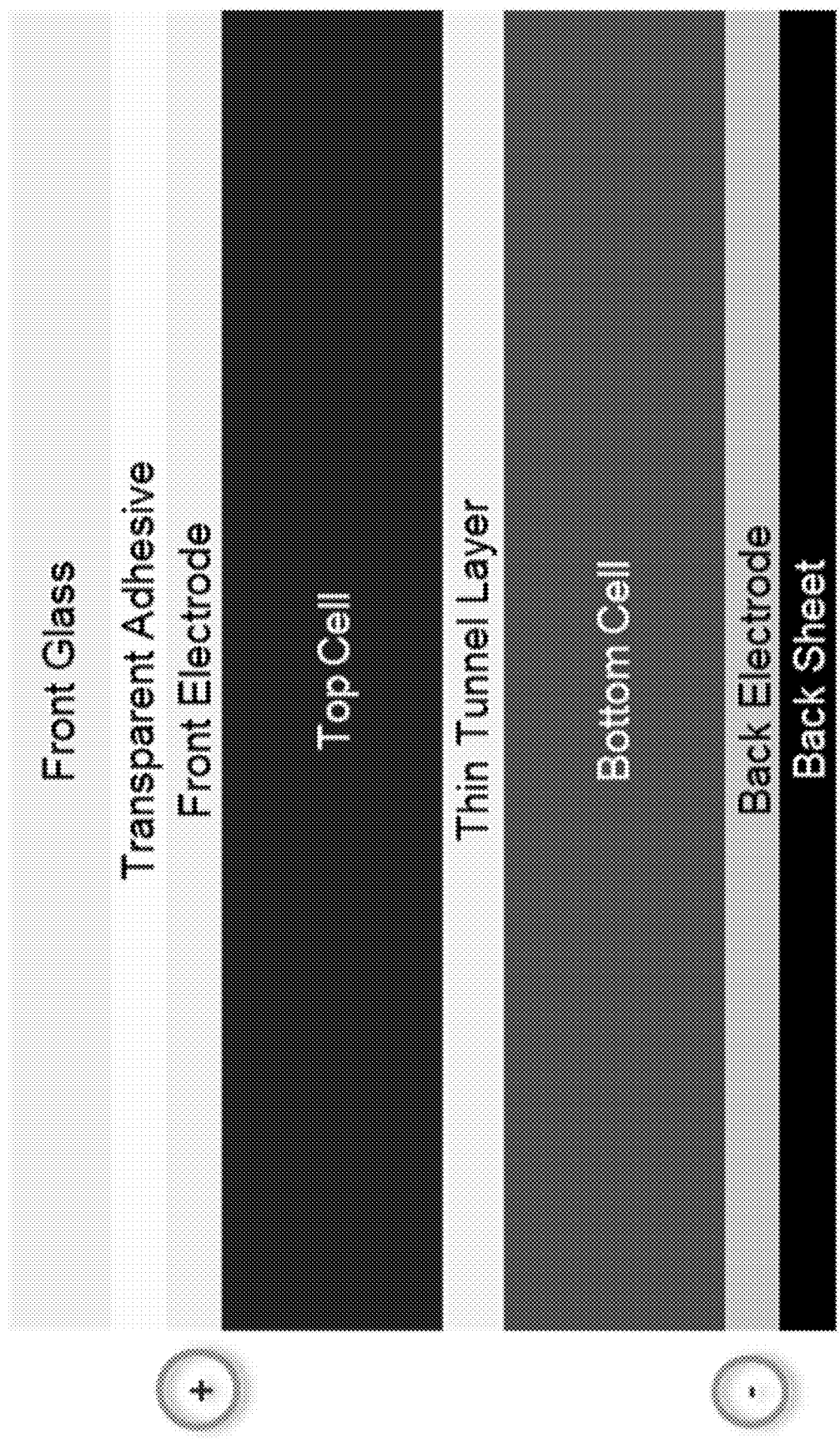
FIG. 14 shows simplified cross-sectional view of a monolithic tandem PV device having two terminals.

The specific embodiment of FIG. 14 is only one possible example of a monolithic tandem device architecture. For example, the backsheet can be replaced by glass or other substance for protecting the bottom cells and the tandem architecture.

Clause 1B. An apparatus comprising:
- a first thin-film photovoltaic (PV) device disposed over a first electrically insulating substrate;
- a first through-substrate-via structure extending through the first electrically insulating substrate and including an electrically conducting substance;
- an electrode in contact with the electrically conducting substance.

Clause 2B. An apparatus as in clause 1B wherein the first thin-film PV device comprises a perovskite PV device.

Clause 3B. An apparatus as in clause 1B wherein the first thin-film PV device is selected from a perovskite PV device, an organic PV device, a polymer PV device, a quantum-dot PV device, a carbon nanotube PV device, a copper indium gallium selenide (CIGS) PV device and its derivative such as $Cu(In_{1-x}Ga_x)SeS$, $0 \leq x \leq 1$, a copper zinc tin sulfide (CZTS) PV device, a cadmium telluride (CdTe) PV device and its derivative, such as CdS and CdSe PV, and other thin-film PV.

Clause 4B. An apparatus as in clause 1B wherein the first thin-film PV device comprises a tandem PV device.

Clause 5B. An apparatus as in clause 1B wherein the electrode comprises the electrically conducting substance.

Clause 6B. An apparatus as in clause 1B wherein the electrically conducting substance overlaps a top electrode of a second thin film PV device.

Clause 7B. An apparatus as in clause 1B wherein the first thin-film PV device comprises:
- an active layer;
- a top electrode layer; and
- at least one other layer selected from a transport layer and a passivation layer.

Clause 8B. An apparatus as in clause 1B wherein the transparent substrate comprises glass.

Clause 9B. An apparatus as in clause 8B wherein the glass has a thickness of between about 1 μm to 2800 μm.

Clause 10B. A method comprising:
- providing an insulating substrate;

forming a via extending through the insulating substrate;
filling the via with an electrically conductive substance; and
establishing an electrical interconnection between a first electrode of a first thin film photovoltaic (PV) device and a second electrode of a second thin film PV device utilizing the electrically conductive substance.

Clause 11B. A method as in clause 10B further comprising forming the first electrode.

Clause 12B. A method as in clause 11B wherein the first electrode is formed prior to filling the via with the electrically conducting substance.

Clause 13B. A method as in clause 11B wherein the first electrode is formed after filling the via with the electrically conducting substance.

Clause 14B. A method as in clause 11B wherein the first electrode is formed with the electrically conducting substance.

Clause 15B. A method as in clause 10B wherein the electrically insulating substrate comprises glass.

Clause 16B. A method as in clause 10B wherein the first thin film PV device comprises a perovskite PV device.

Clause 17B. A method as in clause 10B wherein the first thin film PV device is selected from a perovskite PV device, an organic PV device, a polymer PV device, and a quantum-dot PV device.

Clause 18B. A method as in clause 10B wherein the first thin film PV device comprises a tandem PV device.

Clause 19B. A method as in clause 10B wherein the insulating substrate has a thickness of between about 1 µm to 2800 µm.

Clause 20B. A method as in clause 10B wherein the first thin film PV device and the second thin film PV device are arranged in an overlapping shingled configuration.

It is noted that the use of tandem PV devices (e.g., those having 4-terminals (4-T), or the monolithic 2-terminal (2-T) structure of FIG. 14) can be influenced by (and influence) the structure of the corresponding solar module incorporating such devices.

Figure 22:
FIG. 22 shows a simplified cross-sectional view of one embodiment of a 4-T tandem device.

For example, FIG. 22 shows a simplified cross-sectional view of a 4-terminal tandem PV device 2200. In this particular embodiment, the top cell comprises perovskite.

The bottom cell comprises Si. It may be a number of different possible types, including but not limited to:
heterojunction cell (HJT);
passivated emitter and rear cell (PERC); or
interdigitated back contact (IBC).

Figure 23:
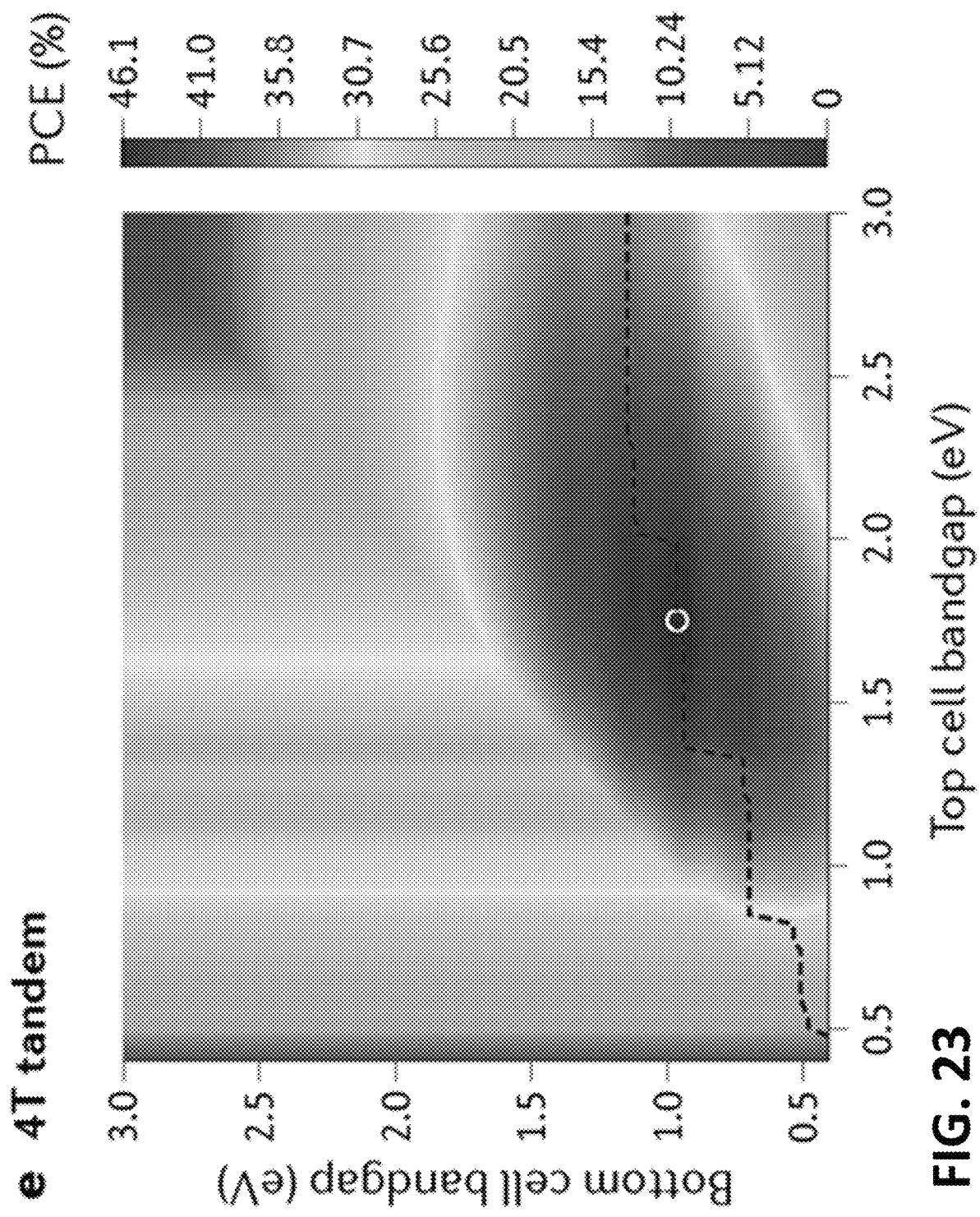
FIG. 23 plots bandgap for top and bottom cells of a 4-T tandem device.

FIG. 23 plots bandgap and Power Conversion Efficiency (PCE) for such a 4-T tandem device. FIG. 23 showing the top cell bandgap as being between about 1.65-1.85 eV. For 4-T tandem, the restriction on the range of top cell bandgap is looser than for 2-T tandem.

Figure 24:
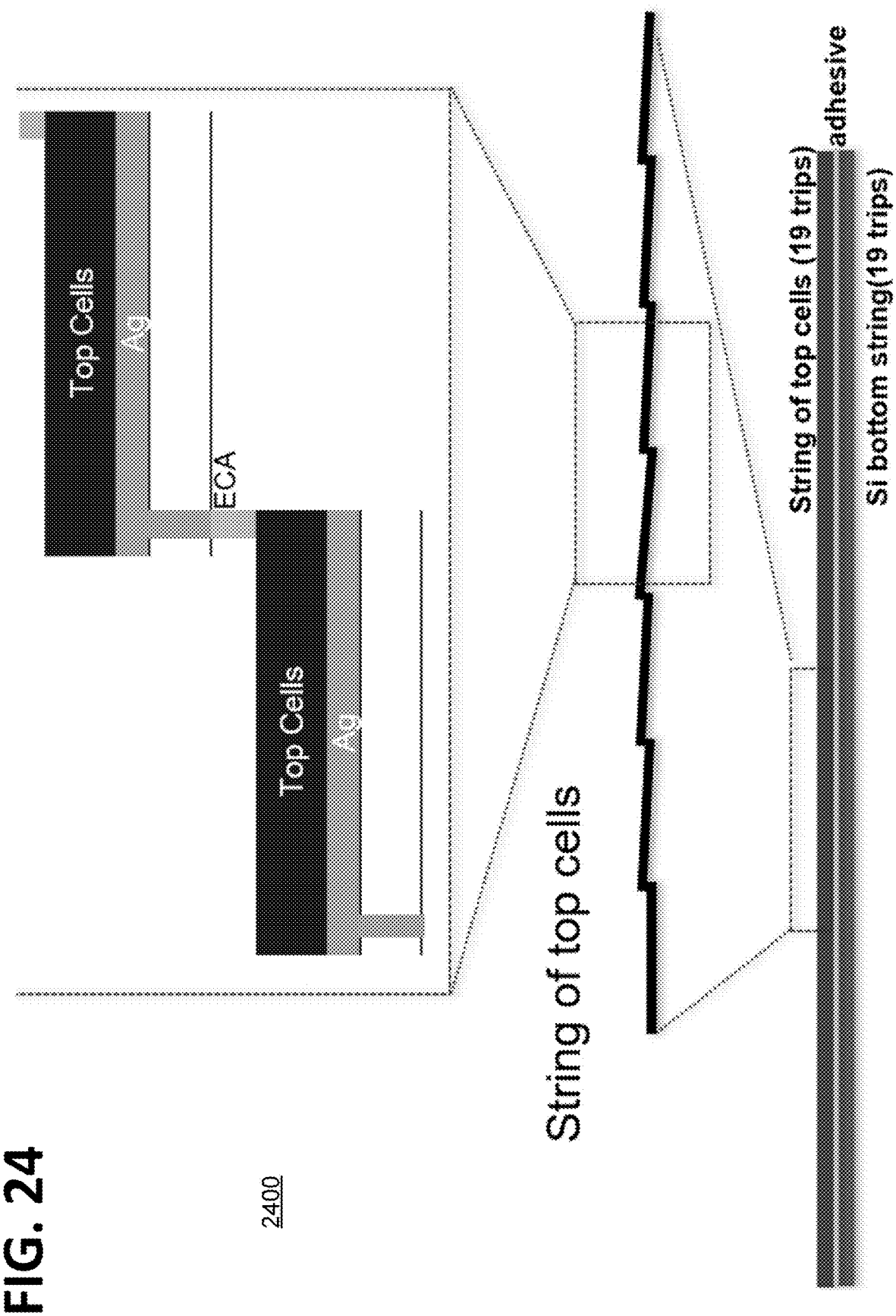
FIG. 24 shows cross-sectional views of a tandem module architecture featuring strings of top and bottom cells.

As shown in the simplified cross-sections of FIG. 24, a module 2400 featuring such 4-T tandem devices may comprise a string of top cells, adhered to a Si bottom string. Here, the use of shingling technology allows optimal matching between current and/or voltage parameters of the bottom and top layers to create a tandem module with desirable performance characteristics.

In particular, shingling technology offers flexibility on:
•changing a number of strips and/or •dimensions of strips in order to adjust the current/voltage of shingled bottom sheet to match with the electrical parameters of the top sheet (whose layout may be relatively restricted by the area and inter-connection design). Also, the •thickness of the PV active materials, and/or their •relative bandgaps, may be tailored in order to reduce voltage and/or current mismatch.

FIG. 25A shows a cross-sectional view, and FIGS. 25B-D show plan views, of one embodiment of a module architecture 2500 featuring 4-T tandem devices, wherein the top string and the bottom string are inter-connected in series. Here, current matching between the top and bottom strings is desired.

This current matching can be accomplished by shingling. In particular, the current of both top and bottom devices (strip, string, or sub-panel) can be optimized according to at least one of:
1) spectral response of the semiconducting materials deployed in absorber layer;
2) thickness of the absorber layer;
3) adjusting the numbers of strips or the dimension size/area of each strip;
4) the way of inter-connecting groups of strings.

In particular, for a module comprising 4-T tandem devices, a number of different types of interconnection can be implemented, with the result that mis-match between top and bottom cells may be addressed in different locations.

Figure 27:
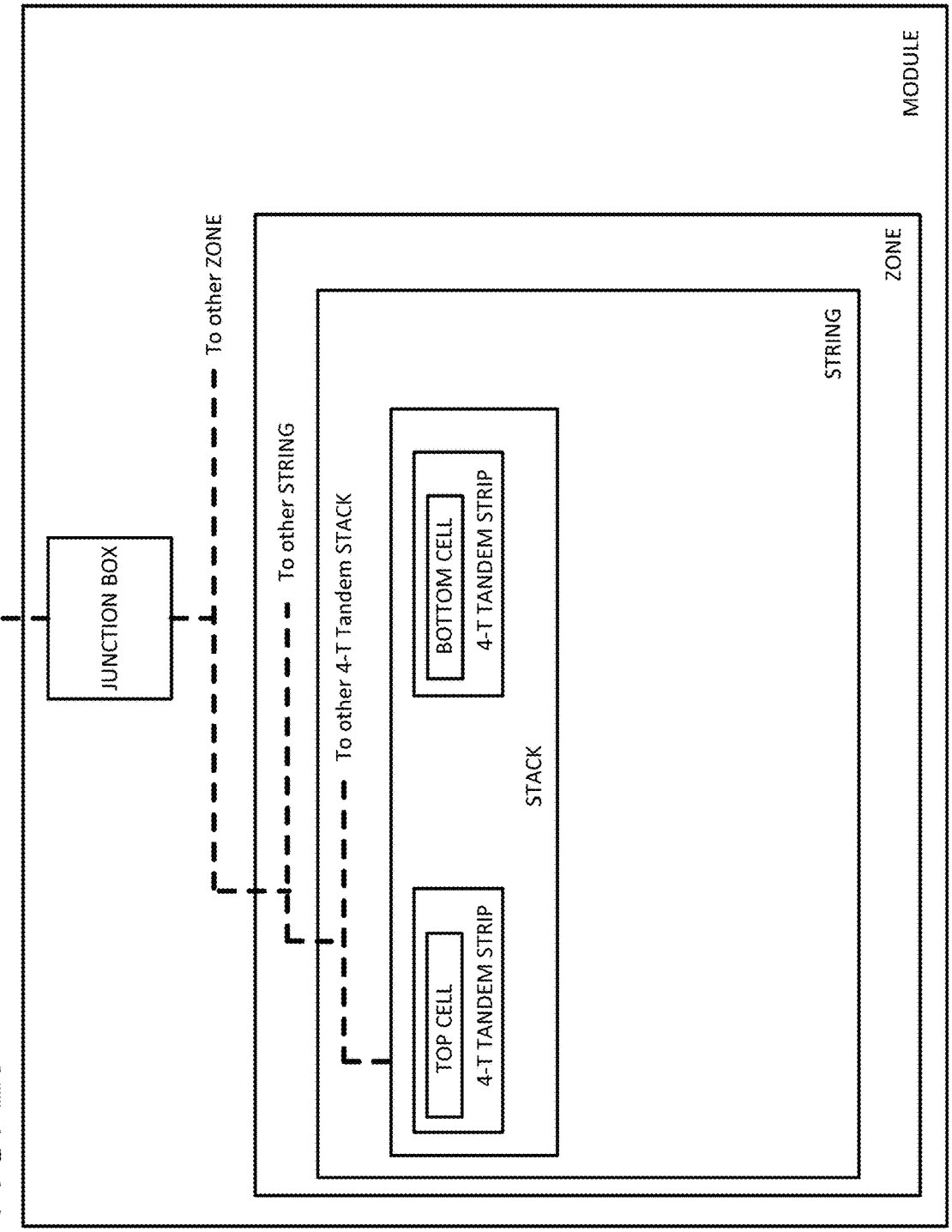
FIG. 27 shows a simplified schematic view of a module comprising 4-T tandem devices and having interconnections between top and bottom cells at the strip level.

In some embodiments, the interconnection is at the strip-strip level. This is shown in FIG. 27. Here, the interconnection starts from the strip level, such that a strip made with (or singulated from) a top workpiece, is connected to a strip made with (or singulated from) a bottom workpiece. Stack refers to a strip-strip level tandem structure, a minimum unit of tandem structure.

Figure 28:
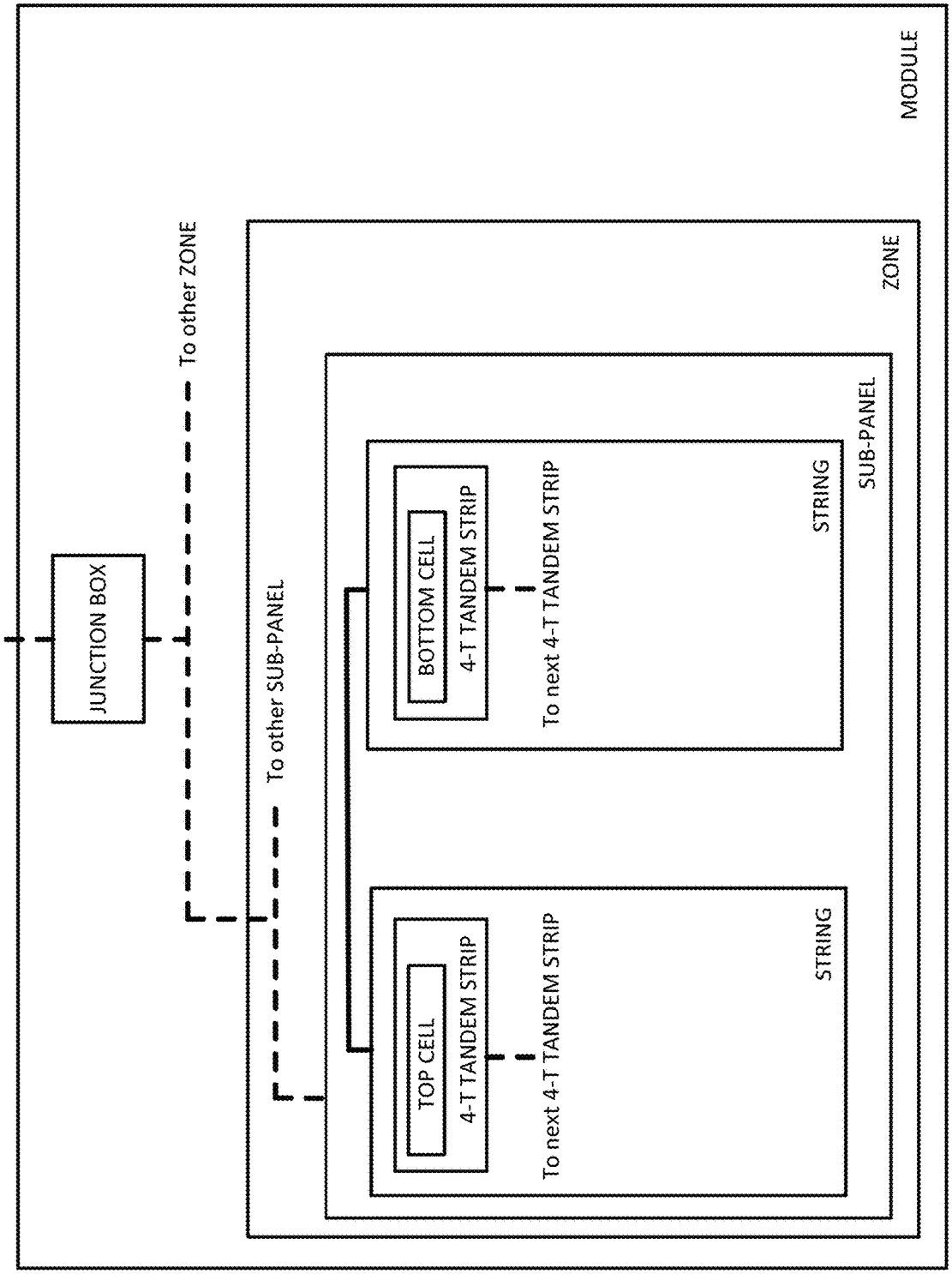
FIG. 28 shows a simplified schematic view of a module comprising 4-T tandem devices and having interconnections between top and bottom cells at the string level.

In other embodiments, the interconnection is at the string-string level. This is shown in FIG. 28. Here, an entire string formed only with strips made (or singulated from) a top workpiece, is connected to a string formed only with strips made (or singulated from) a bottom workpiece. The term sub-panel refers to a grouping of such top and bottom strings.

Figure 29:
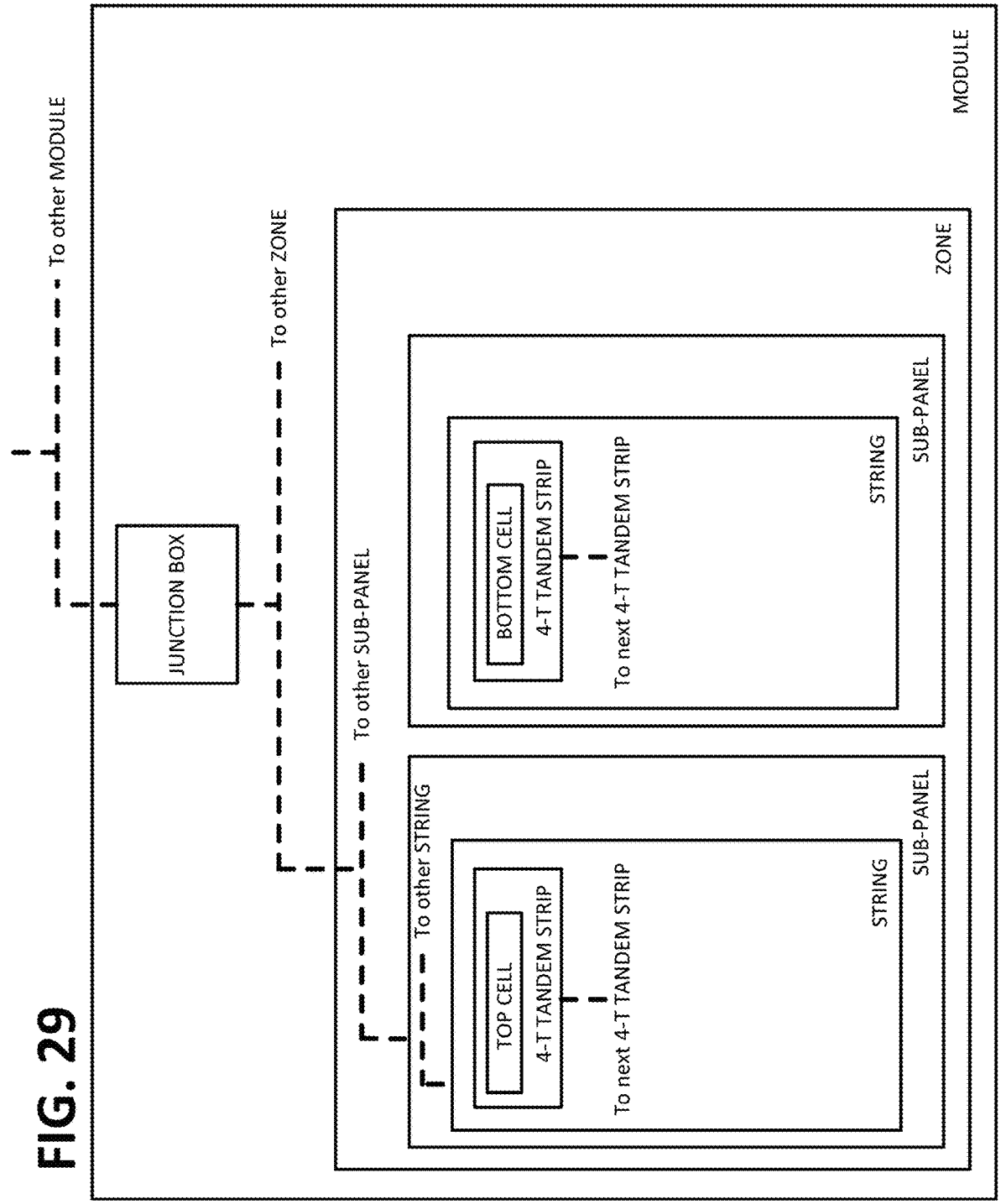
FIG. 29 shows a simplified schematic view of a module comprising 4-T tandem devices and having interconnections between top and bottom cells at the sub-panel level.

According to still other embodiments, several strings (sub-panel 1) formed with strips made with (or singulated from) a top workpiece are connected together to form a sub-panel first. Then, such a sub-panel is connected to another sub-panel (sub-panel 2) comprising several strings formed with strips made with (or singulated from) a bottom workpiece. As shown in FIG. 29, this creates a zone 1. This zone 1 then is connected to another zone (zone 2) that is similarly constructed.

According to some embodiments, interconnection can occur at the module level. Here, a top sub-module is formed by zone-string-strip made (or singulated from) a top workpiece. The bottom sub-module is formed by zone-string-strip made (or singulated from) a bottom workpiece.

Figure 30:
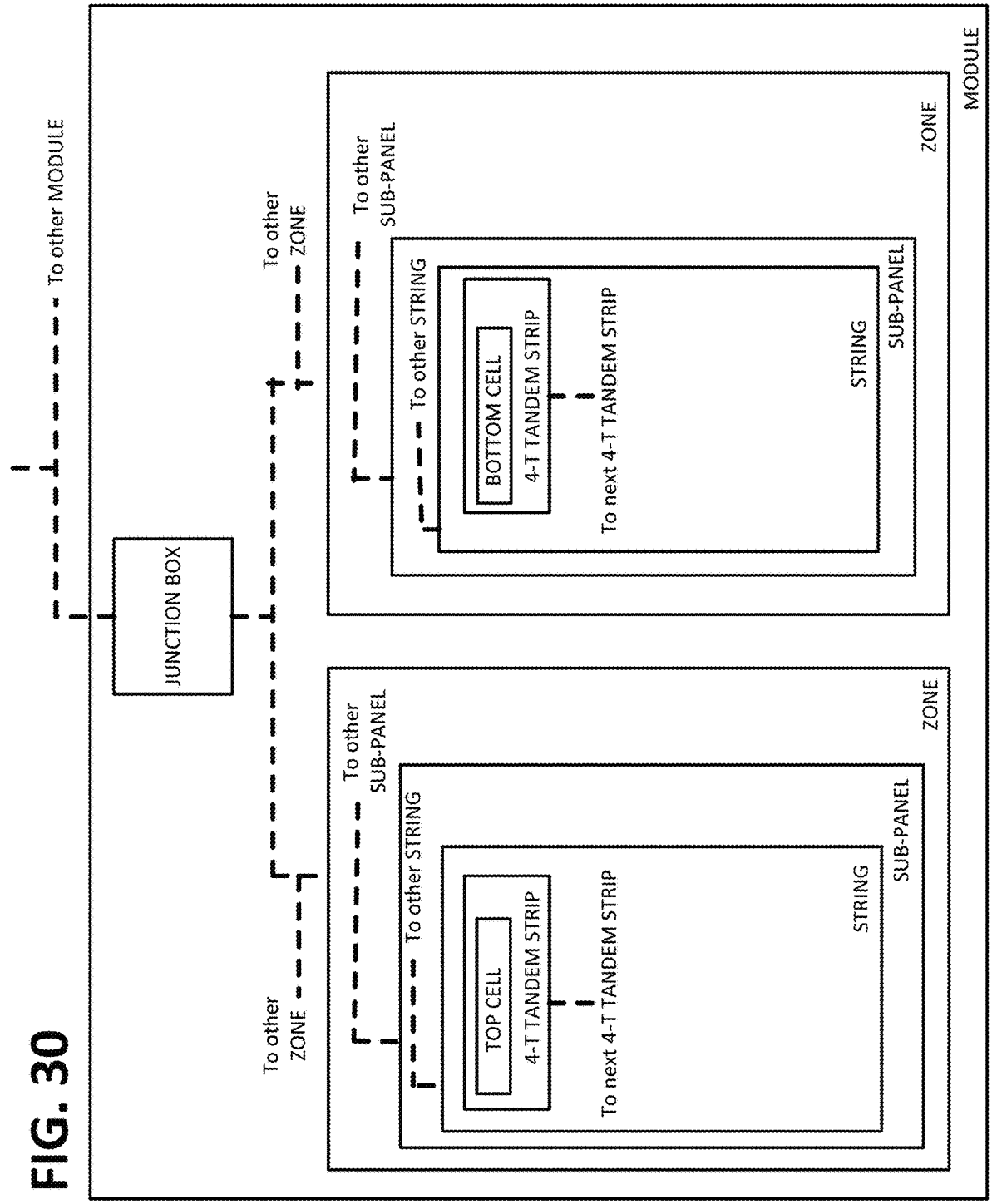
FIG. 30 shows a simplified schematic view of a module comprising 4-T tandem devices and having interconnections between top and bottom cells at the module level using one junction box.

FIG. 30 shows a simplified schematic view of an embodiment of a module comprising 4-T tandem devices and having interconnections between top and bottom cells at the module level using one junction box.

Figure 31:
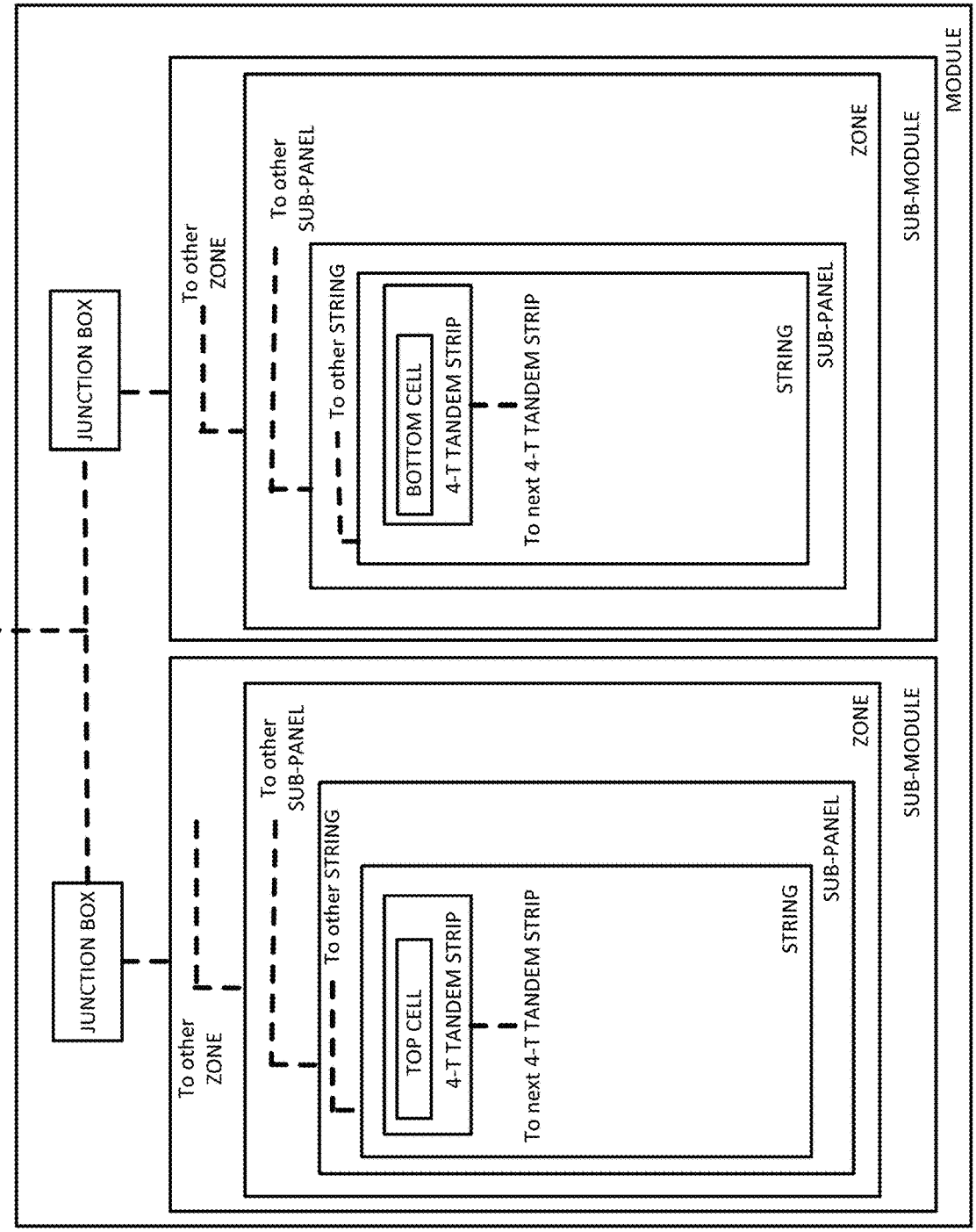
FIG. 31 shows a simplified schematic view of a module comprising 4-T tandem devices and having interconnections between top and bottom cells at the module level using two junction boxes.

FIG. 31 shows a simplified schematic view of an embodiment of a module comprising 4-T tandem devices and having interconnections between top and bottom cells at the module level using two separate junction boxes.

To make the current of a top cell of a tandem device match with the current of the bottom cell of a tandem device, the flexibility of shingling technology allows increasing/decreasing the size/area and number of strips to make the top or bottom devices, whichever is made with shingling technology, to generate the same current as the other one. Thus, if using p-PERC cell to make bottom devices (strip, string, or sub-panel), the strip current can be determined by the size (area) of the p-PERC strip.

In one example a p-PERC cell with 158.75 mm*158.75 mm size, has Isc (short circuit current) of ~10.4A and Voc (open circuit voltage) of ~0.67V. If the entire cell is scribed into 5 strips, each strip has Isc ~2.08A and Voc 0.67V. When cell size increases, the Isc and Voc can change.

While increasing the cuts (strip number) per cell, the Isc can be reduced. When the strips get interconnected in series, the Isc of string is close to the Isc of one strip while the Voc of string is close to the sum of Voc of each strip.

The sub-panel current/voltage can be adjusted by optimizing the string inter-connection. For example, if a sub-panel is formed by connecting strings in series, then the Isc of sub-panel is close to that of one string and Voc is close to the sum of string Voc. If the sub-panel is formed by connecting strings in parallel, then the Isc is the sum of string Isc and Voc is close to that of one string. Thus, whether the top and bottom devices are inter-connected at strip, string or sub-panel level, the current/voltage can be flexibly adjusted by applying shingling technology to improve match between top and bottom devices.

Such current/voltage matching will help maximize the power output of modules. Furthermore, shingling technology can also reduce the hotspot risk. The series-parallel connection providing protection against shading can reduce the hot-spot temperature.

Typically, for p-PERC of 158.75 mm*158.75 mm size, a string with 19 ⅕-cell 5-cut strips may have an Isc of 1.9-2.1A and a Voc of 11-13V. For HJT of 158.75 mm*158.75 mm size, a string with 19 pieces of ⅕-cell 5-cut strips may exhibit an Isc of 1.8-2.1A and a Voc of 13-15V. When cell size increases, the Isc and Voc can change.

FIG. 26A shows a cross-sectional view, and FIGS. 26B-D show plan views of another module architecture 2600 featuring 4-T tandem devices, wherein the top string and the bottom string are inter-connected in parallel. Here, voltage matching between the top and bottom strings is desired.

This voltage matching can be accomplished by shingling. In particular, the voltage can be adjusted by the Voc of top and bottom devices (strip, string, and sub-panel), which can be determined by one or more of:

1) the bandgap of semiconducting material for absorber layer (e.g. at the strip level or the smallest shingling unit level);
2) the number of strips for one string when the strips are inter-connected in series as discussed above. Shingling technology can flexibly control the string Voc by adding/removing strips;
3) the manner of inter-connecting groups of strings.

Typically, for p-PERC of 158.75 mm*158.75 mm size, a string with 19 pieces of ⅕-cell 5-cut strips may exhibit an Isc of 1.9-2.1A and Voc of 11-13V. For HJT of 158.75 mm*158.75 mm size, a string having 19 pieces of 5-cut⅕-cell strips may exhibit an Isc of 1.8-2.1A and Voc of 13-15V. When cell size increases, the Isc and Voc can change.

Another example of the benefits of shingling technology in electrical parameter matching, arises in the context of modules featuring monolithic two-terminal tandem devices.

FIG. 32 shows a simplified cross-sectional view of a device 2700 comprising 2-terminal monolithic tandem PV cells. In particular, the top cell comprises perovskite; the bottom cell comprises Si.

Figure 33:
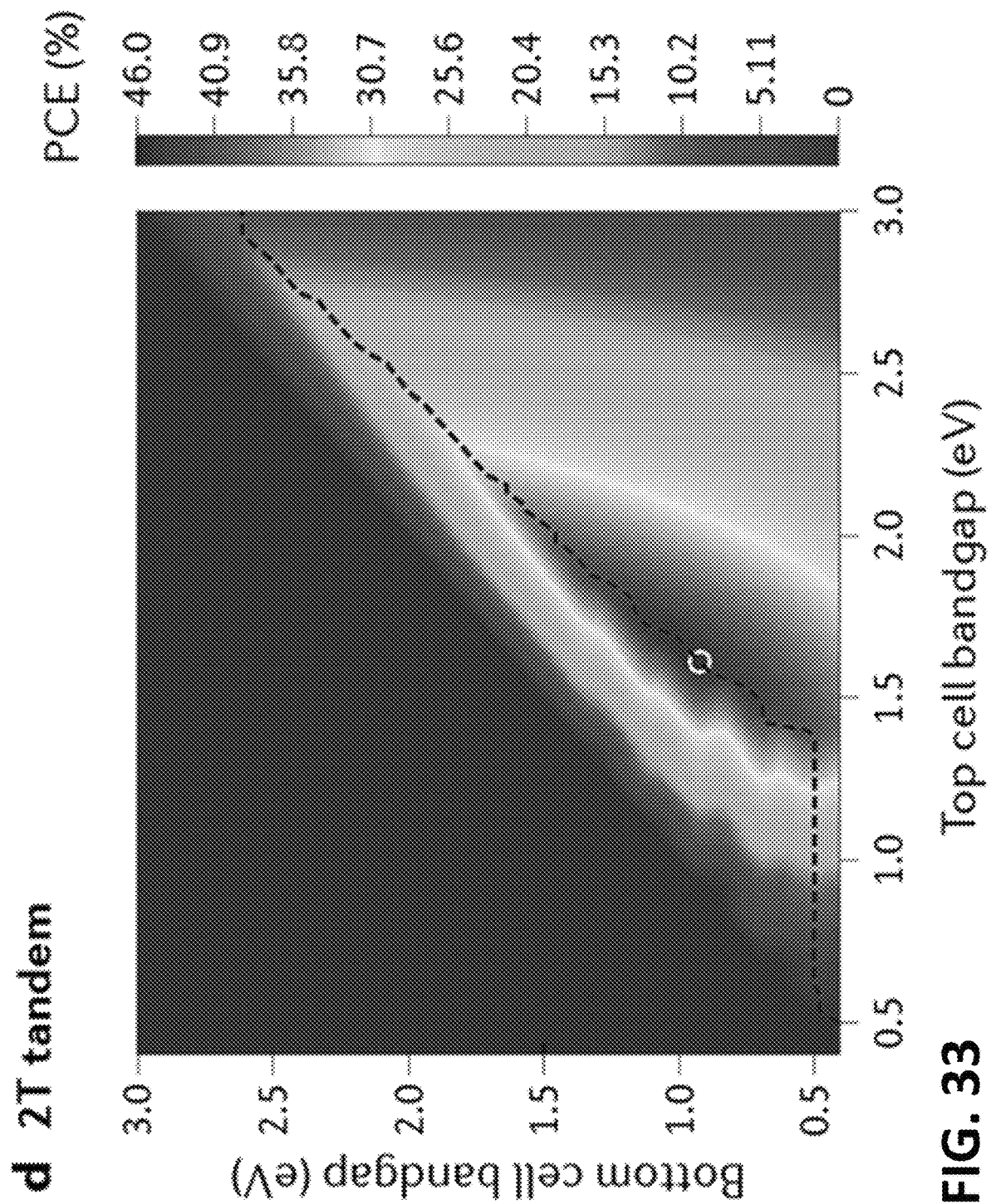
FIG. 33 plots bandgap for top and bottom cells of a 2-T tandem device.

FIG. 33 plots bandgap and Power Conversion Efficiency (PCE) for such a 2-T tandem device. FIG. 33 shows the top cell bandgap as being between around 1.7 eV.

Figure 34:
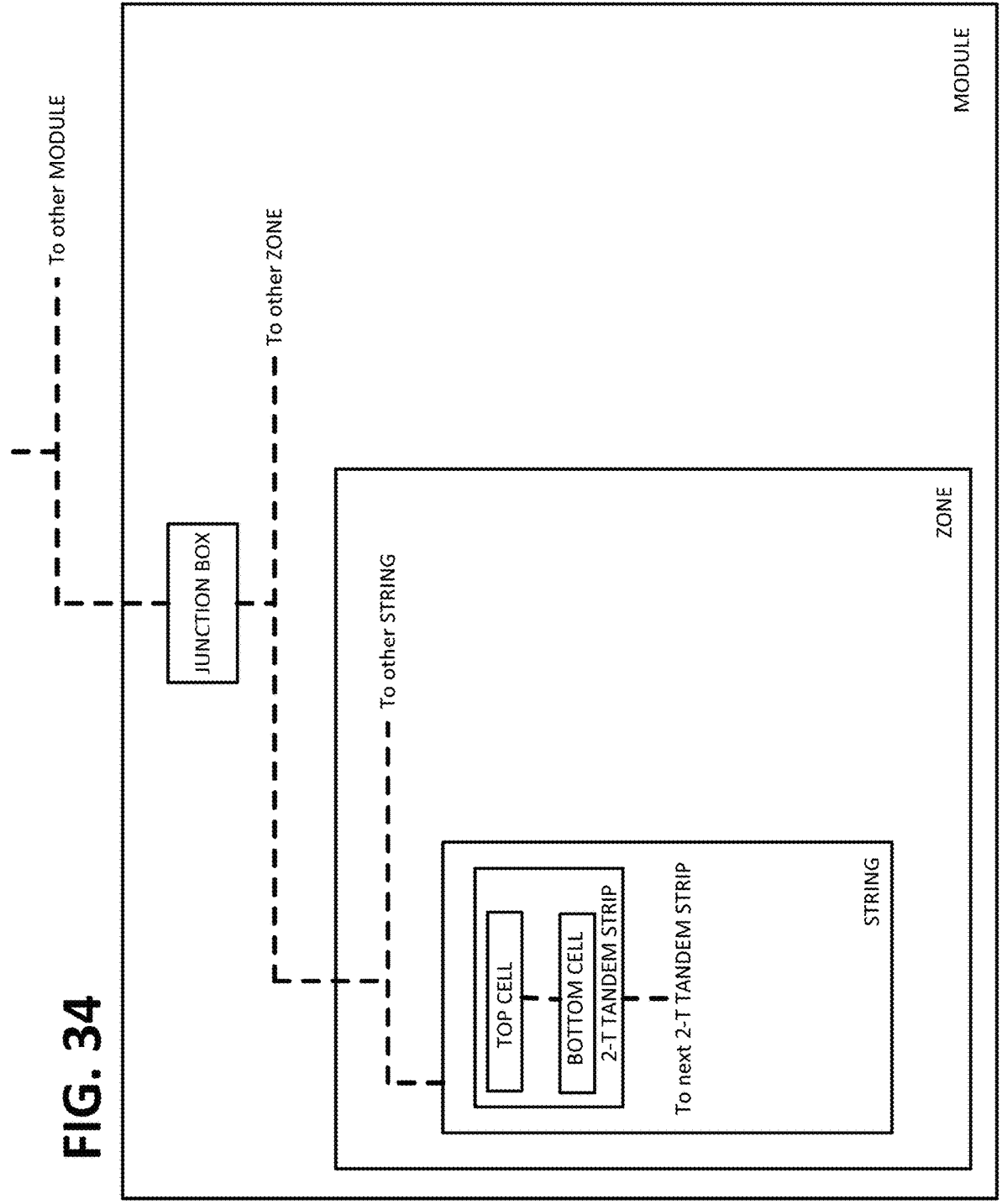
FIG. 34 shows a simplified schematic view of a module comprising 2-T tandem devices.

FIG. 34 shows a simplified schematic view of a module comprising 2-T tandem devices. Shingling of such a tandem cell can permit output of the proper electrical parameters to maximize power, while reducing risks of hot spots and other losses due to mismatch.

Specifically, shingling approaches offer flexibility of adding more strips. This can make it easier to design the electrical parameters at one or more of the following levels in order to maximize power:

string, and/or
zone (parallel groupings of strings), and/or
module (groupings of zones).

In particular, the singulated strips comprising 2-T tandem PV devices, can exhibit a variety of different efficiencies, with the lowest efficiency of any one strip determining the efficiency of that string. Generally, the overall magnitude of such differences in efficiency between strips, is determined by the size (e.g., dimensions) of the singulated strip. That is, singulated strips exhibit reduced variation in minimum efficiency. Accordingly, by using shingling technology to determine the 2-T tandem strip size, the amount of mismatch can be balanced against any losses attributable to the use of more (smaller sized) strips.

Typically, perovskite-Si 2-T tandem cell may exhibit a current density of 18-20 mA/cm2, corresponding to an Isc of 4.5-5.5 A for 158.75 mm*158.75 mm size (G1 size). The Voc of such 2-T tandem cell is 1.3-2.0 V. When using ⅕-cell strip, the Isc of each strip is 0.9-1.1A while the Voc is 1.3-2.0 V. When forming a 19-strip string, the Voc is 16-26 V and the Isc is 4.5-5.5 A. When cell size increases, the Isc and Voc can change.

Clause 1C. A method comprising:
determining a property of a shingled string architecture comprising a first tandem photovoltaic (PV) device having a top cell and a bottom cell, and a second tandem PV device comprising a top cell and a bottom cell, in order to control a mismatch in an electrical characteristic between the first tandem PV device and the second tandem PV device.

Clause 2C. A method as in clause 1C wherein:
the first tandem PV device and the second tandem PV device comprise four-terminal (4-T) PV devices;
respective top cells of the first tandem PV device and the second tandem PV device are disposed in a top string;
respective bottom cells of the first tandem PV device and the second tandem PV device are disposed in a bottom string adhered to the top string by an adhesive.

Clause 3C. A method as in clause 2C wherein:
the top cell of the first tandem PV device is in serial electrical communication with the bottom cell of the first tandem PV device;
the top cell of the second tandem PV device is in serial electrical communication with the bottom cell of the second tandem PV device; and
the electrical characteristic comprises current.

Clause 4C. A method as in clause 3C wherein the property comprises at least one of:
a bandgap of an active PV layer of the top cell of the first tandem PV device;
a bandgap of an active PV layer of the bottom cell of the first tandem PV device;
a thickness of the active PV layer of the top cell of the first tandem PV device;
a thickness of the active PV layer of the bottom cell of the first tandem PV device; and
a number of tandem PV devices present in the shingled string arrangement.

Clause 5C. A method as in clause 2C wherein:
the top cell of the first tandem PV device is in parallel electrical communication with the bottom cell of the first tandem PV device;

the top cell of the second tandem PV device is in parallel electrical communication with the bottom cell of the second tandem PV device; and the electrical characteristic comprises voltage.

Clause 6C. A method as in clause 5C wherein the property comprises at least one of:
- a bandgap of an active PV layer of the top cell of the first tandem PV device;
- a bandgap of an active PV layer of the bottom cell of the first tandem PV device;
- a thickness of the active PV layer of the top cell of the first tandem PV device;
- a thickness of the active PV layer of the bottom cell of the first tandem PV device; and
- a number of tandem PV devices present in the shingled string arrangement.

Clause 7C. A method as in clause 1C wherein:
the first tandem PV device and the second tandem PV device comprise two-terminal (2-T) PV devices;
the property comprises dimensions of the first tandem PV device and the second tandem PV device; and
the electrical characteristic comprises power conversion efficiency.

Clause 1D. An apparatus comprising:
a first tandem PV device in shingled arrangement with a second PV device, wherein a property of the first tandem PV device is determined in order to control a mismatch in an electrical characteristic between the first tandem PV device and the second tandem PV device.

Clause 2D. An apparatus as in clause 1D wherein the first tandem PV device comprises a four terminal (4-T) tandem device.

Clause 3D. An apparatus as in clause 2D wherein the first tandem PV device comprises a passived emitter and rear cell (PERC).

Clause 4D. An apparatus as in clause 3D wherein the first tandem PV device comprises a shingled strip exhibiting a short circuit current (Isc) of about 2.08A, and an open circuit voltage (Voc) of about 0.67V.

Clause 5D. An apparatus as in clause 4D wherein the first tandem PV device and the second tandem PV device are part of a string exhibiting an Isc of between about 1.9-2.1A and a Voc of between about 11-13V.

Clause 6D. An apparatus as in clause 2D wherein the first tandem PV device comprises a heterojunction cell.

Clause 7D. An apparatus as in clause 6D wherein the first tandem PV device and the second tandem PV device are part of a string exhibiting a short circuit current (Isc) of about 1.8-2.1 A, and an open circuit voltage (Voc) of between about 13-15V.

Clause 8D. An apparatus as in clause 1D wherein the first tandem PV device comprises a two terminal (2-T) tandem device.

Clause 9D. An apparatus as in clause 8D wherein the first tandem PV device comprises perovskite.

Clause 10D. An apparatus as in clause 9D wherein the first tandem PV device comprises a shingled strip exhibiting a short circuit current (Isc) of between about 0.9-1.1A, and an open circuit voltage (Voc) of between about 1.3-1.92V.

Clause 11D. An apparatus as in clause 10D wherein the first tandem PV device is part of a string exhibiting an Isc of between about 4.5-5.5A and a Voc of between about 16-26V.

While the above is a full description of the specific embodiments, various modifications, alternative constructions and equivalents may be used. Although the above has been described using a selected sequence of steps, any combination of any elements of steps described as well as others may be used. Additionally, certain steps may be combined and/or eliminated depending upon the embodiment.

Of course there can be other variations, modifications, and alternatives. Therefore, the above description and illustrations should not be taken as limiting the scope of the present invention which is defined by the appended claims.

What is claimed is:

1. An apparatus comprising a four terminal tandem PV device comprising:
   a first thin-film photovoltaic (PV) cell comprising:
   a perovskite layer;
   a first electrically insulating substrate disposed over a back side of the perovskite layer;
   a first through substrate via (TSV) structure extending through the first electrically insulating substrate; and
   an electrode extending through the first TSV structure to make electrical contact with the perovskite layer, the electrode covering only a portion of a back side of the first electrically insulating substrate; and
   a second thin-film PV cell.

2. An apparatus as in claim 1 wherein the perovskite layer overlaps the second thin-film PV cell.

3. An apparatus as in claim 2 wherein the second thin-film PV cell comprises:
   an active layer;
   a top electrode layer;
   a bottom electrode layer; and
   at least one other layer selected from a transport layer, a passivation layer, a back-transfer blocking layer, and an in-situ barrier layer.

4. An apparatus as in claim 1 wherein the first electrically insulating substrate comprises glass.

5. An apparatus as in claim 4 wherein the glass has a thickness of between about 1 µm-3200 µm.

6. An apparatus as in claim 2 wherein the second thin-film PV cell is an Interdigitated Back Contact (IBC) solar cell.

7. An apparatus as in claim 1 wherein the first thin-film PV cell is an Interdigitated Back Contact (IBC) solar cell.

8. An apparatus as in claim 1 wherein the perovskite layer comprises halide perovskite.

* * * * *